US007989876B2

(12) United States Patent
Yasuda

(10) Patent No.: US 7,989,876 B2
(45) Date of Patent: Aug. 2, 2011

(54) NONVOLATILE SEMICONDUCTOR MEMORY DEVICE

(75) Inventor: Naoki Yasuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 848 days.

(21) Appl. No.: 11/822,579

(22) Filed: Jul. 9, 2007

(65) Prior Publication Data
US 2008/0073704 A1    Mar. 27, 2008

(30) Foreign Application Priority Data

Sep. 22, 2006    (JP) .................................. 2006-257754

(51) Int. Cl.
*H01L 29/792* (2006.01)
(52) U.S. Cl. ................................. 257/324; 257/E29.309
(58) Field of Classification Search .................. 257/324, 257/E29.309
See application file for complete search history.

(56) References Cited

U.S. PATENT DOCUMENTS

| 5,151,758 | A  | * | 9/1992  | Smith ............................ 257/287 |
| 5,548,139 | A  | * | 8/1996  | Ando ............................. 257/192 |
| 6,489,628 | B1 | * | 12/2002 | Morizuka ......................... 257/12 |
| 6,903,407 | B1 | * | 6/2005  | Kang ............................. 257/315 |
| 7,432,156 | B1 | * | 10/2008 | Lee et al. ........................ 438/260 |
| 2003/0042558 | A1 | * | 3/2003  | Noguchi et al. ............... 257/406 |
| 2003/0235080 | A1 | * | 12/2003 | Yaegashi et al. ......... 365/185.22 |
| 2004/0037116 | A1 | * | 2/2004  | Kuo et al. ................. 365/185.18 |
| 2005/0006696 | A1 |   | 1/2005  | Noguchi et al. |
| 2005/0275343 | A1 | * | 12/2005 | Tanaka et al. ................. 313/504 |
| 2005/0285180 | A1 |   | 12/2005 | Mitani et al. |
| 2006/0291287 | A1 | * | 12/2006 | Furnemont ............. 365/185.18 |
| 2007/0007583 | A1 | * | 1/2007  | Lee et al. ...................... 257/324 |
| 2007/0042547 | A1 |   | 2/2007  | Kikuchi et al. |
| 2007/0108508 | A1 | * | 5/2007  | Lin et al. ....................... 257/324 |
| 2007/0132004 | A1 |   | 6/2007  | Yasuda et al. |
| 2007/0215929 | A1 |   | 9/2007  | Yasuda |
| 2007/0284646 | A1 |   | 12/2007 | Kikuchi |
| 2008/0093661 | A1 | * | 4/2008  | Joo et al. ....................... 257/324 |

FOREIGN PATENT DOCUMENTS

| JP | 2004-55969  | 2/2004  |
| JP | 2004-363329 | 12/2004 |
| JP | 2005-12219  | 1/2005  |

(Continued)

OTHER PUBLICATIONS

A Notification of Reasons for Rejection mailed on Dec. 2, 2008, from the Japanese Patent Office in counterpart Japanese Application No. No. 2006-257754, and an English language translation thereof.

(Continued)

*Primary Examiner* — Kiesha R Bryant
*Assistant Examiner* — Igwe U Anya
(74) *Attorney, Agent, or Firm* — Finnegan, Henderson, Farabow, Garrett & Dunner, L.L.P.

(57) ABSTRACT

The present invention provides a nonvolatile semiconductor memory device including memory cells capable of electrically writing information, and each of the memory cells includes a first insulating film formed on the channel provided between source/drain diffusion layers, an electric charge accumulation layer formed on the first insulating film and is made of nitride or oxynitride containing at least one selected from Si, Ge, Ga, and Al, a donor layer containing n-type dopant impurity formed on the electric charge accumulation layer and is made of nitride or oxynitride containing at least one selected from among Si, Ge, Ga, and Al, a second insulating film formed on the donor layer, and a control gate electrode formed on the second insulating film.

18 Claims, 12 Drawing Sheets

FOREIGN PATENT DOCUMENTS

| | | |
|---|---|---|
| JP | 2005-340768 | 12/2005 |
| JP | 2006-13003 | 1/2006 |

OTHER PUBLICATIONS

A. Chin et al., "Low Voltage High Speed $SiO_2$/AlGaN/AlLaO$_3$/TaN Memory with Good Retention," IEDM Technical Digest, pp. 165-168 (2005).

T. Maeda et al., "Ge Metal-Insulator-Semiconductor Structures with $Ge_3N_4$ Dielectrics by Direct Nitridation of Ge Substrates," Appl. Phys. Lett., vol. 85, No. 15, pp. 3181-3183 (2004).

J. Goss et al., "Vacancy-Impurity Complexes and Limitations for Implantation Doping of Diamond," Physical Review B, vol. 72, No. 3, pp. 035214-1-11 (2005).

F. Oba et al., "Effective Doping in Cubic $Si_3N_4$ and $Ge_3N_4$: A First-Principles Study," J. Am. Ceram. Soc., vol. 85, No. 1, pp. 97-100 (2002).

W. Götz et al., "Activation Energies of Si Donors in GaN," Appl. Phys. Lett., vol. 68, No. 22, pp. 3144-3146 (1996).

A.-D. Li et al., "Characteristics of $LaAlO_3$ Gate Dielectrics on Si Grown by Metalorganic Chemical Vapor Deposition," Appl. Phys. Lett., vol. 83, No. 17, pp. 3540-3542 (2003).

H.-P. Baldus et al., "Silicon Phosphorus Nitride, the First Ternary Compound in the Silicon-Phosphorus-Nitrogen System," Chem. Mater., vol. 5, pp. 845-850 (1993).

R. Ohba, "Impact of Stoichiometry Control in Double Junction Memory on Future Scaling," IEDM Tech. Dig., pp. 897-900 (2004).

R. Ohba, "35 nm Floating Gate Planar MOSFET Memory Using Double Junction Tunneling," IEDM Tech. Dig., pp. 873-876 (2005).

E. Suzuki et al., "Traps Created at the Interface Between the Nitride and the Oxide on the Nitride by Thermal Oxidation," Appl. Phys. Lett., vol. 42, No. 7, pp. 608-610 (1983).

* cited by examiner

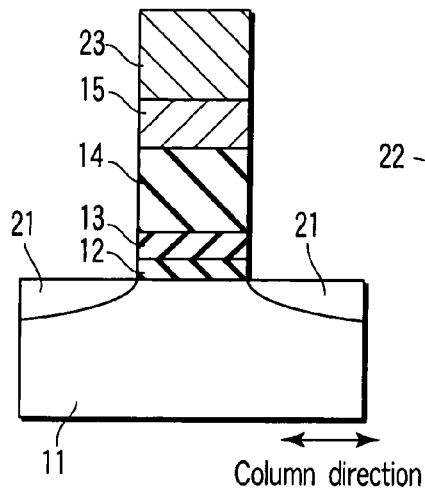
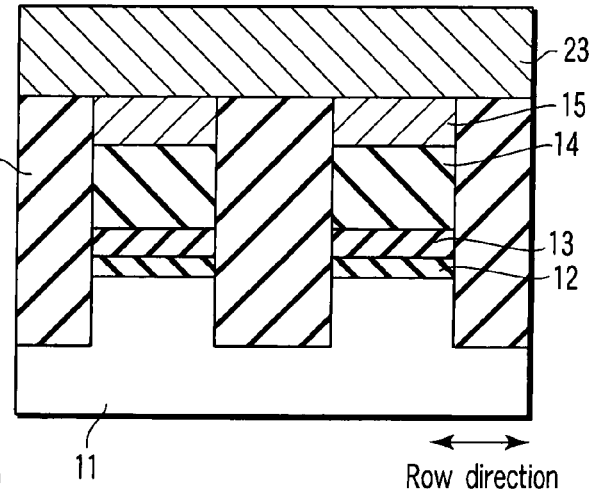
FIG. 1A  FIG. 1B
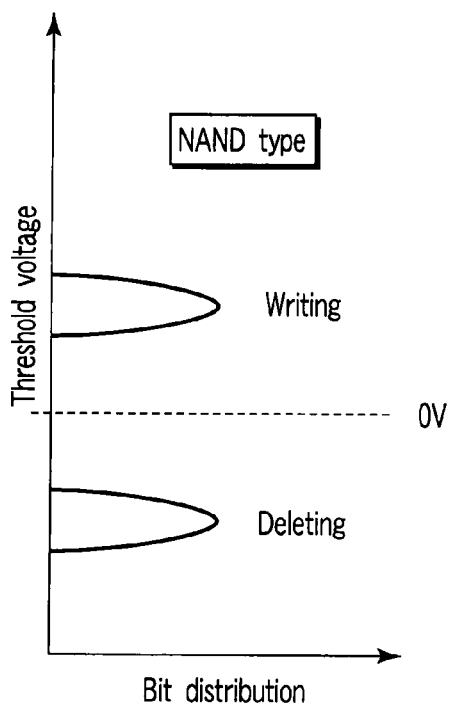
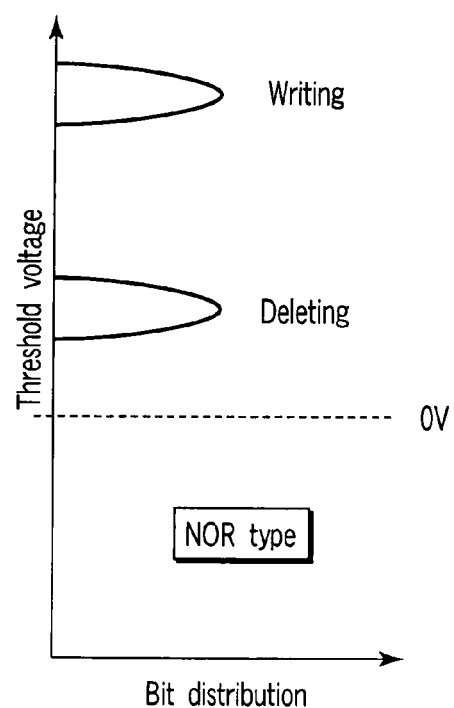
FIG. 2A  FIG. 2B

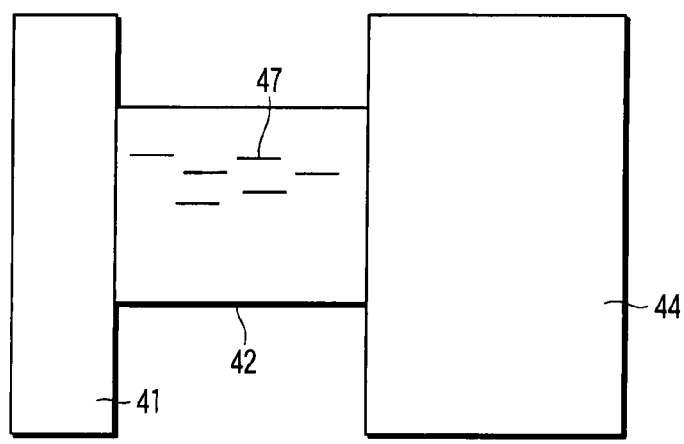
F I G. 4A
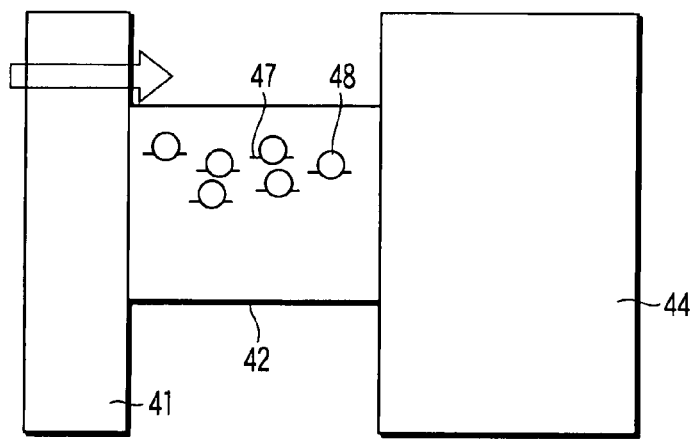
F I G. 4B
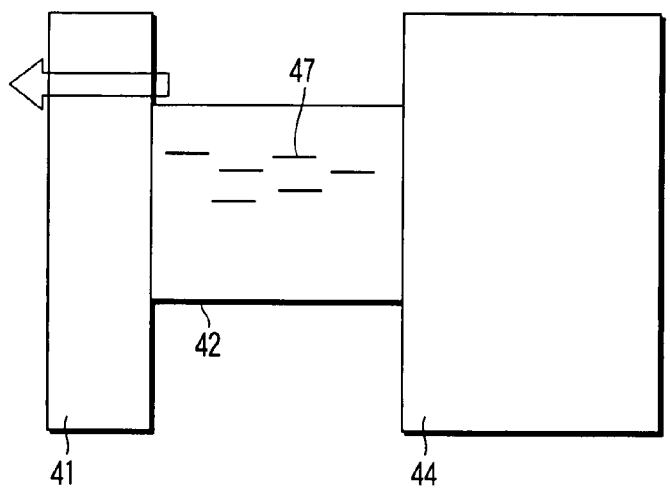
F I G. 4C

| Donor layer \ Trap layer | Si₃N₄ [Ge₃N₄] | AlGaN |
|---|---|---|
| AlGaN(Si) (Ge can be used) | AlGaN(Si)/Si₃N₄ | AlGaN(Si)/AlGaN |
| Si₃N₄(P) (As,Sb can be used) | Si₃N₄(P)/Si₃N₄ | Si₃N₄(P)/AlGaN |
| Metal material | TaSi₂/Si₃N₄ | TaN/AlGaN |
F I G. 6
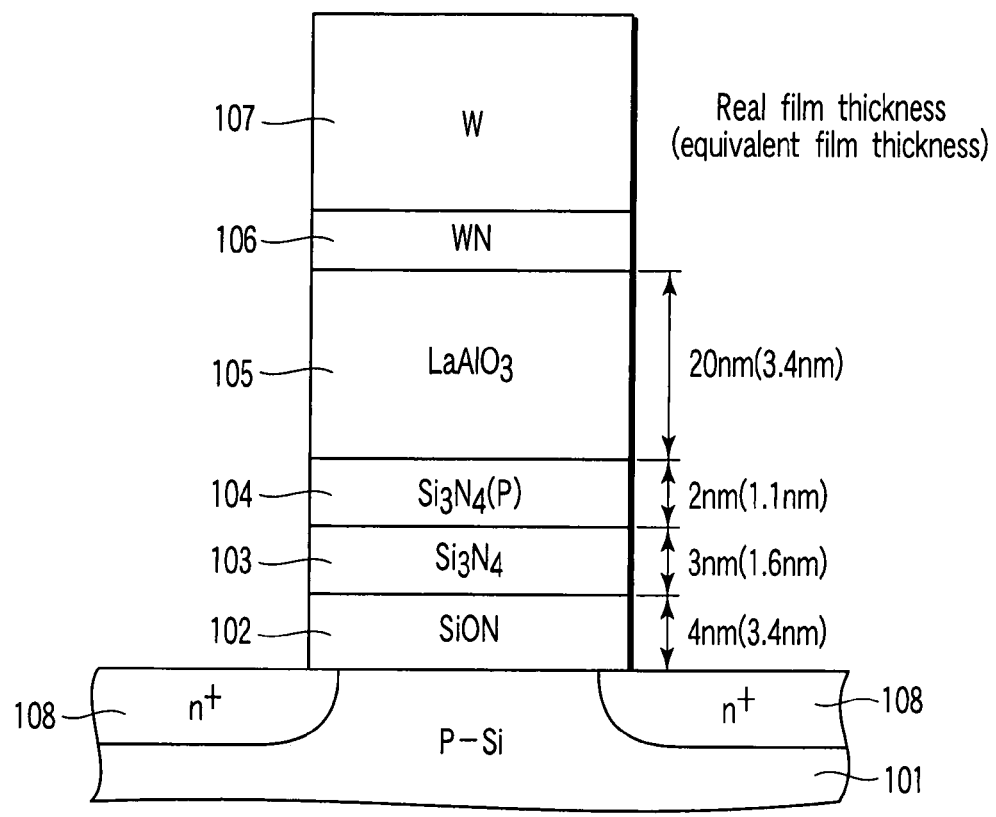
F I G. 7

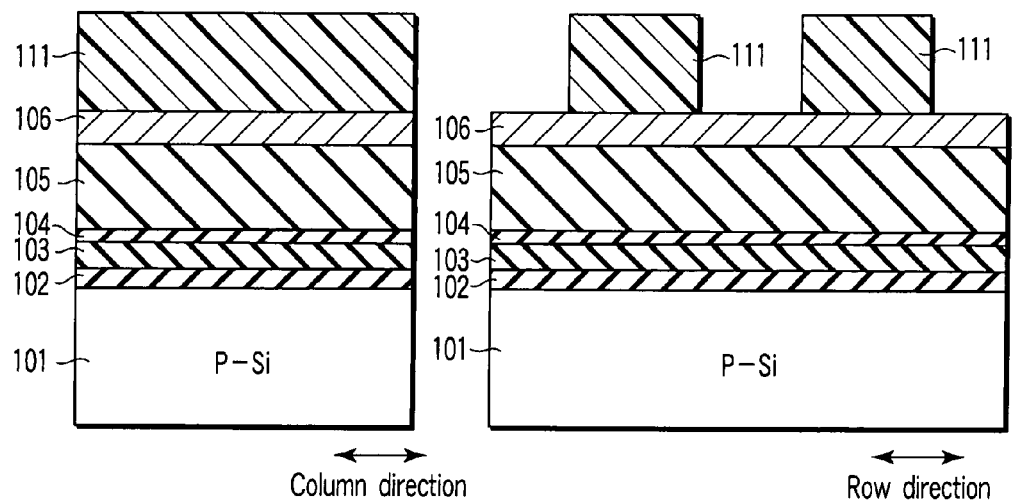
F I G. 8A   F I G. 8B
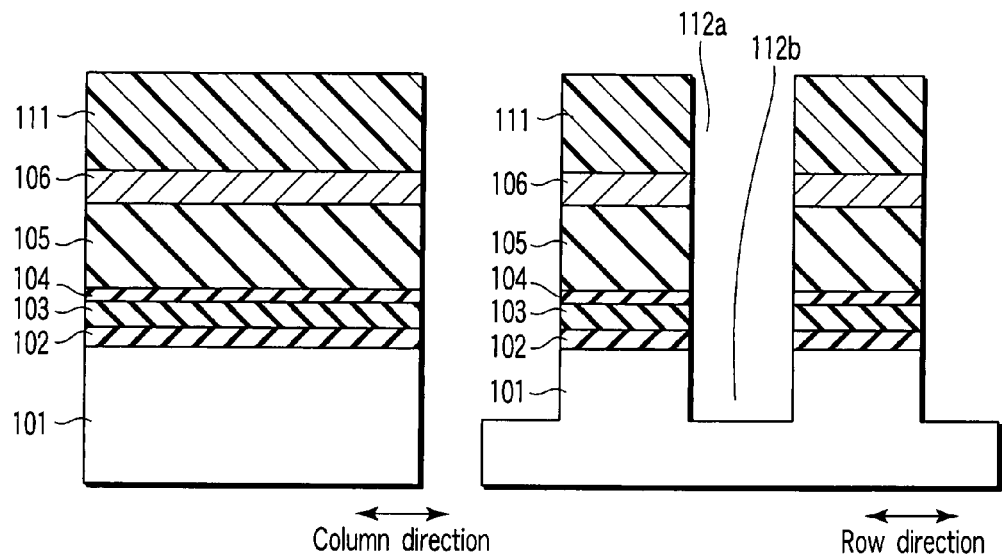
F I G. 9A   F I G. 9B

NONVOLATILE SEMICONDUCTOR MEMORY DEVICE

CROSS-REFERENCE TO RELATED APPLICATIONS

This application is based upon and claims the benefit of priority from prior Japanese Patent Application No. 2006-257754, filed Sep. 22, 2006, the entire contents of which are incorporated herein by reference.

BACKGROUND OF THE INVENTION

1. Field of the Invention

The present invention relates to a nonvolatile semiconductor memory device that uses memory cells having electric charge accumulation layers made of insulating films.

2. Description of the Related Art

In a NAND flash memory having floating gates, as the miniaturization is being advanced, there arise problems of interference among neighboring cells and difficulty in burying insulating films between cells. Accordingly, it becomes necessary for this type of flash memory to change the structure of memory cells (cell transistors).

Memory cells considered to be most promising for a gate length around 20 nm are those having electric charge accumulation layers made of insulating films. These memory cells are called MONOS (metal/oxide-film/nitride-film/oxide-film/semiconductor), which are realized by forming gate stack structures on the channels between source/drain diffusion layers on a Si substrate. The gate stack structure are composed of a tunnel insulating film to pass through electric charges for writing or erasing data, a silicon nitride film that functions as an electric charge accumulation layer, a silicon oxide film that functions as an insulating film for preventing currents from flowing, and a gate electrode formed thereon, etc. Since this MONOS memory cell is configured in the form of a flat cell, above-described problems raised in the conventional floating gate type NAND flash memory can be solved.

However, the MONOS memory cell has some performance problems to be solved, such as the magnitude of the variation of the threshold voltage (abbreviated as Vth, hereinafter), endurance characteristics, data retention characteristics, etc. In addition, there is a problem that the threshold voltage of the MONOS memory cell is not compatible with the threshold voltage which is necessary for a NAND-type flash memory cell used for mass storage.

That is, the threshold voltage of the MONOS memory cell is often in the range of Vth>0 both after writing and after erasing data. This fits into the range of threshold voltage required in a NOR flash memory, but is different from that of a NAND flash memory which should fulfill Vth>0 after writing data and Vth<0 after erasing data. Actually, even in a MONOS memory cell whose performance is considered to be the highest, although Vth after writing data can be made sufficiently large, Vth of sufficiently large negative value cannot be obtained as the threshold voltage after erase operation (for example, a document 1 (A. Chin, C. C. Laio, C. Chen, K. C. Chiang, D. S. Yu, W. J. Yoo, G. S. Samudra, T. Wang, I. J. Hsieh, S. P. McAlister, and C. C. Chi, "low voltage High Speed $SiO_2$/AlGaN/AlLaO$_3$/TaN Memory with Good Retention", IEDM Tech. Dig. pp. 165-168 (2005))). Accordingly, it is difficult to employ the MONOS memory cell for a NAND flash memory, although the MONOS is suited for a NOR flash memory.

In employing the MONOS memory cell for a NAND flash memory, there is a problem that the threshold voltage has to be adjusted. So as to adjust the threshold voltage, there may be a method of adjusting the dopant impurity concentration in the channel regions of a Si substrate. As the miniaturization of memory cell is being advanced, the short channel effect becomes noticeable, and it is necessary to increase the neutral threshold voltage (initial threshold voltage under which data is not written or erased) so as to suppress the short channel effect. On the other hand, as described above, since the neutral threshold voltage is decreased in the operation of a NAND flash memory, discrepancy between the demands for the neutral threshold voltage becomes severe as the miniaturization is being advanced. That is, the above-described problem cannot be solved by adjusting the dopant impurity concentration of the channel regions.

In this way, there is the problem that the threshold voltage of the conventional MONOS memory cell does not fit into the threshold voltage required in the operation of a NAND flash memory. Even though an attempt is made to solve the problem by adjusting the substrate dopant impurity concentration, it is extremely difficult to employ the method for the miniaturized NAND flash memory.

BRIEF SUMMARY OF THE INVENTION

According to an aspect of the invention, there is provided a nonvolatile semiconductor memory device comprising:
a plurality of memory cells capable of electrically writing, erasing, and reading information,
each of the memory cells including:
a semiconductor substrate having a main surface;
source/drain diffusion layers which are separately formed on the main surface of the semiconductor substrate;
a first insulating film formed on a channel provided between the source/drain diffusion layers;
an electric charge accumulation layer formed on the first insulating film, the electric charge accumulation layer being made of nitride or oxynitride containing at least one selected from Si, Ge, Ga, and Al;
a donor layer formed on the electric charge accumulation layer, the donor layer being made of nitride or oxynitride containing at least one selected from Si, Ge, Ga, and Al, and containing n-type dopant impurity;
a second insulating film formed on the donor layer; and
a control gate electrode formed on the second insulating film.

BRIEF DESCRIPTION OF THE SEVERAL VIEWS OF THE DRAWING

FIGS. 1A and 1B show sectional views indicative of the device structures of a MONOS memory cell used in a NAND flash memory;

FIGS. 2A and 2B show views indicative of the distributions of the threshold voltage of a flash memory;

FIGS. 4A to 4C show band diagrams in the electrically neutral state, the state after writing data, and the state after erasing data of a MONOS memory cell;

FIG. 6 shows a table in which combinations of trap layers and donor layers in relation to embodiments are collectively represented;

FIG. 7 shows a sectional view to explain the detailed structure of the memory cell along the channel length direction according to a first embodiment;

FIGS. 8A and 8B show sectional views indicative of a part of steps of producing the memory cell in the first embodiment;

FIGS. 9A and 9B show sectional views indicative of a part of steps of producing the memory cell in the first embodiment;

DETAILED DESCRIPTION OF THE INVENTION

Figure 3A:
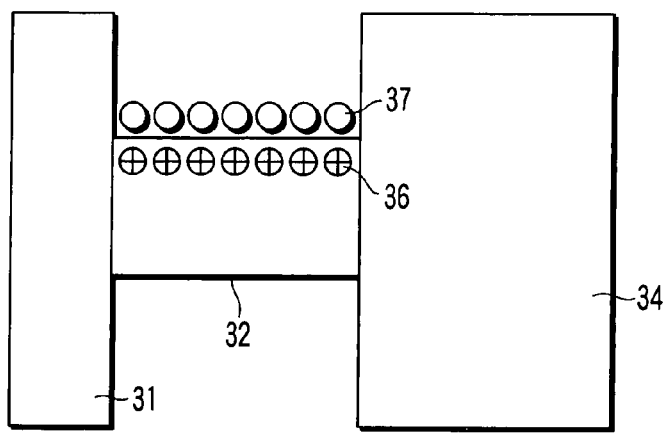
FIGS. 3A to 3C show band (energy band) diagrams in the electrically neutral state, the state after writing data, and the state after erasing data of a floating gate type memory cell.

The present invention is applied to nonvolatile semiconductor memory devices that use memory cells of a MONOS structure. Of these, especially, the present invention is applicable to a NAND flash memory which is used as a large capacity semiconductor storage device. In such a nonvolatile semiconductor memory device, so as to decrease the interference among neighboring memory cells when the memory cells are miniaturized, the flat cell structure is employed in which the respective cells are separated by silicon oxide films.

Firstly, before explaining embodiments, a reference example of the present invention will be explained.

FIG. 1A and FIG. 1B are views for explaining a reference example of the present invention. FIG. 1A shows a sectional view of a MONOS memory cell along the channel length direction, while FIG. 1B shows a sectional view thereof along the channel width direction. In FIG. 1A and FIG. 1B, a direction in which the word line (control gate electrode) extends is defined as the row direction, and a direction which is perpendicular to the row direction is defined as the column direction.

As shown in FIG. 1A, on the channel region of a silicon substrate (including well) 11 in which p-type impurity is doped, there is formed a tunnel oxide film 12 of approximately 3 to 4 nm in thickness. Furthermore, on the tunnel oxide film 12, there are formed a silicon nitride film 13 of approximately 4 nm in thickness, a silicon oxide film (block insulating film) 14 of approximately 10 nm in thickness, and a phosphorus-doped polycrystalline silicon film (control gate electrode) 15 of approximately 100 nm in thickness, in this order. Then, by ion-implanting impurity into the silicon substrate 11 with the gate used as a mask, there are formed $n^+$-type source/drain diffusion layers 21.

As shown in FIG. 1B, at the control gate 15, block insulating film 14, silicon nitride film 13, and tunnel oxide film 12, there are formed slits for separating memory cells which are adjacent to each other in the row direction. Furthermore, by etching the silicon substrate 11 at thus formed slit parts, there are formed device-separating trenches of approximately 100 nm in depth on the silicon substrate 11. Silicon oxide films (buried oxide films) 22 are buried into these slits and device-separating trenches. Then, on the control gate electrodes 15 and silicon oxide films 22, there is formed a conducting film (word line) 23 made of, for example, tungsten of approximately 100 nm in thickness.

Next, the relationship of threshold voltage values of a general memory cell employed in a NAND flash memory and in a NOR flash memory, and the relationship of threshold voltage values of a memory cell having a floating gate and of a MONOS memory cell will be explained.

As has been described above, in a NAND flash memory, as shown in FIG. 2A, the threshold voltage after writing data fulfills Vth>0, while the threshold voltage after erasing data fulfills Vth<0. On the other hand, in general, in a NOR flash memory, as shown in FIG. 2B, both the threshold voltage after writing data as well as threshold voltage after erasing data fulfill Vth>0.

On the other hand, in a MONOS memory cell, the threshold voltages thereof are similar to those of a NOR flash memory shown in FIG. 2B, and often fulfill Vth>0 after writing data as well as after erasing data. In a MONOS memory cell whose performance is considered to be the highest, which is disclosed in the document 1, even if Vth after writing data can be made sufficiently large, Vth of sufficiently large negative value cannot be obtained as the threshold voltage after erasing data.

Next, the principle of the present invention will be explained using energy band diagrams.

Figure 3B:
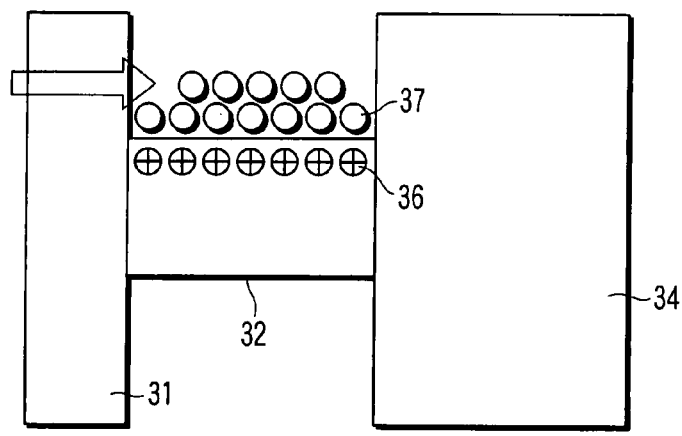
Figure 3C:
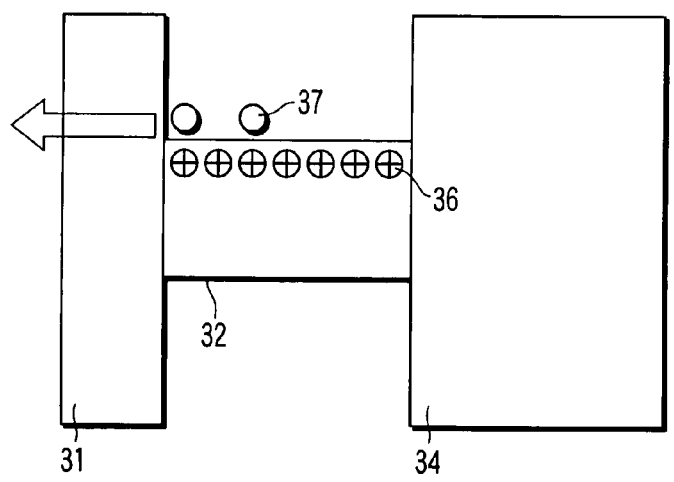

FIG. 3A to FIG. 3C show band diagrams of a floating gate type memory cell. In these figures, the reference numeral 31 indicates a tunnel insulating film, 32 indicates a floating gate ($n^+$-type polycrystalline silicon), 34 indicates a block insulating film, 36 indicates a donor ion, and 37 indicates a free electron.

FIG. 3A shows a band diagram of the floating gate type memory cell in the neutral state (state in which data is not written or erased). The floating gate 32 made of $n^+$-type polycrystalline silicon is in the neutral state as a whole, in which electric charges are not accumulated. In a detailed view, n-type dopant impurity of the polycrystalline silicon is in the state of the donor ions 36 by emitting electrons. Then, the emitted free electrons 37 in the polycrystalline silicon conduction band and electric charges of the positively-charged donor ions 36 are electrically balanced with each other, which keeps the electric neutrality.

FIG. 3B shows a band diagram of the floating gate type memory cell in the neutral bias condition after writing data thereto. Since injected electrons are accumulated in the floating gate 32, the threshold voltage is shifted in the positive direction.

FIG. 3C shows a band diagram of the floating gate type memory cell in the neutral bias condition after erasing data therefrom. In the erase operation, even after passing through the neutral condition of the floating gate 32, electrons are continuously pulled out from the floating gate 32. The continuous extraction of electrons is possible because, as described above, there are a large amount of free electrons 37 emitted from donor atoms of the floating gate 32, and the free electrons exist in the conduction band of the floating gate 32 even in the electrically neutral state.

FIG. 4A to FIG. 4C show band diagrams of a MONOS memory cell. In these figures, the reference numeral 41 indicates a tunnel insulating film, 42 indicates a trap insulating film ($Si_3N_4$), 44 indicates a block insulating film, 47 indicates a trap, and 48 indicates a trapped electron.

FIG. 4A shows a band diagram of the MONOS memory cell in the neutral state. In the electrically neutral state, the electrons 48 are not accumulated in the traps 47 of the silicon nitride film.

FIG. 4B shows a band diagram of the MONOS memory cell in the neutral bias condition after writing data thereto. In this state, the electrons 48 are trapped in the silicon nitride film which functions as an electric charge accumulation layer, and the threshold voltage is shifted in the positive direction.

FIG. 4C shows a band diagram of the MONOS memory cell in the neutral bias condition after erasing data therefrom. In the erase operation, electrons more than those already trapped in the silicon nitride film in the neutral state cannot be emitted. Accordingly, in the MONOS memory cell, in the erase operation, the threshold voltage cannot be shifted in the negative direction sufficiently.

Figure 5A:
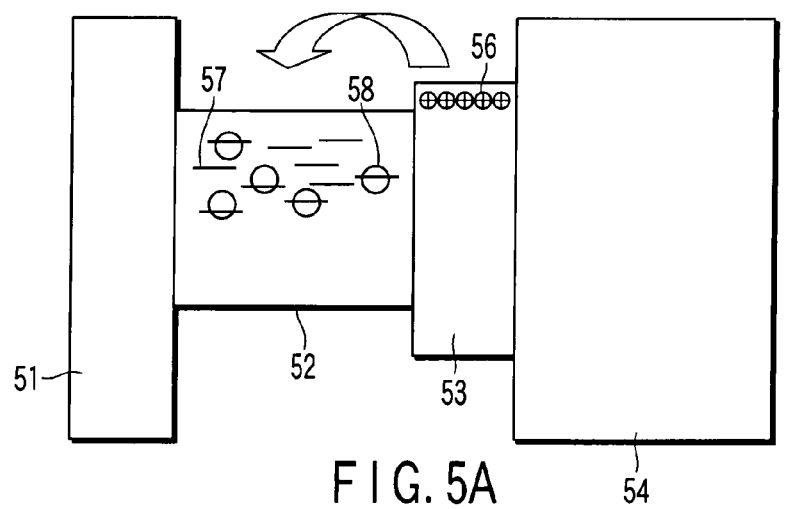
FIGS. 5A to 5C show band diagrams in the electrically neutral state, the state after writing data, and the state after erasing data of the memory cell according to the present invention.
Figure 5B:
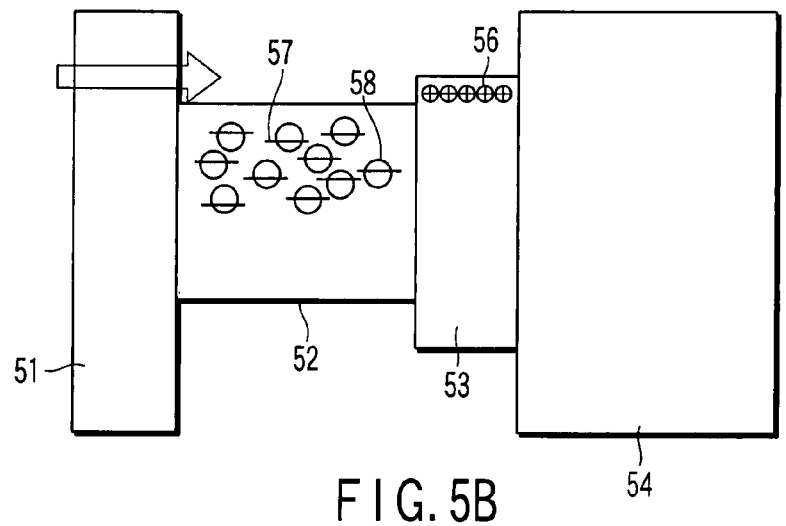
Figure 5C:
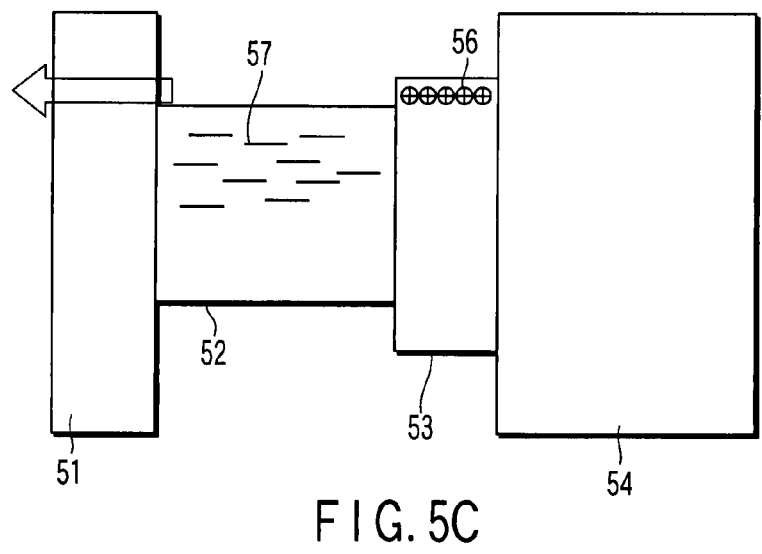

FIG. 5A to FIG. 5C show band diagrams of a memory cell, which is an example of the present invention. In these figures, the reference numeral 51 indicates a tunnel insulating film, 52 indicates a trap insulating film ($Si_3N_4$), 53 indicates a donor layer, 54 indicates a block insulating film, 56 indicates a donor ion, 57 indicates a trap, and 58 indicates a trapped electron.

FIG. 5A shows a band diagram of the memory cell according to the present invention in the neutral state. In this example, the electric charge accumulation layer (trap insulating film) 52 and the donor layer 53 are adjacent to each other. Accordingly, electrons 58 emitted from the donor atoms 56 in the donor layer 53 are captured into the traps 57 in the electric charge accumulation layer 52, which occurs naturally in the electrically neutral state.

In this case, it is noted that, in the neutral state, donor electric charges of the donor layer 53 should fill in part of the traps 57 in the electric charge accumulation layer 52. The reason is that, in case all the traps 57 are filled, more electrons cannot be trapped in the electric charge accumulation layer 52 during writing operation. This condition is met when the trap density per unit area of the electric charge accumulation layer 52 is larger than the donor atom density per unit area of the donor layer 53. To realize this condition, there may be employed a method of making the physical film thickness of the donor layer 53 smaller than the physical film thickness of the electric charge accumulation layer 52. Otherwise, there may also be employed a method of making the trap density of the electric charge accumulation layer 52 sufficiently large. When employing the latter case, there may be considered a method of using a Si-rich silicon nitride film whose trap density is larger than that of a normal silicon nitride film, or a method of forming a large amount of traps on the surface of a silicon nitride film by performing thermal oxidation at high temperature for a short duration after forming the silicon nitride film.

In supplying electrons from the donor layer 53 to the traps 57 of the electric charge accumulation layer 52, electrons cannot be supplied to traps with a small electron affinity. Accordingly, it is desired that the electron affinity of the electric charge accumulation layer 52 be equal to or larger than the electron affinity of the donor layer 53. Furthermore, so as to avoid electrons from being supplied to the block insulating film 54 from the donor layer 53, it is desired that the electron affinity of the block insulating film 54 be smaller than the electron affinity of the donor layer 53.

FIG. 5B shows a band diagram of the memory cell in the neutral bias condition after writing data thereto. All the traps 57 of the electric charge accumulation layer 52 capture the electrons 58.

FIG. 5C shows a band diagram of the memory cell in the neutral bias condition after erasing data therefrom. Since all the electrons, including those electrons 58 trapped in the electric charge accumulation layer 52 in the neutral state, are discharged in the erase state, the threshold voltage can be shifted in the negative direction sufficiently.

As described above, in the example of the present invention, the distribution of the threshold voltage which fulfills Vth>0 after writing data and Vth<0 after erasing data that is required by the operation of a NAND flash memory can easily be realized.

In the above-described example, the electric charge accumulation layer and the donor layer are stacked films adjacent to each other. However, the present invention is not restricted thereto. Other than this, the electric charge accumulation layer may include donor atoms, and then the electric charge accumulation layer also functions as the donor layer. Specifically, the electric charge accumulation layer may be made of a compound or a mixture which contains donor atoms homogeneously, or there may be employed a method of including donor atoms as fine particles or nanocrystals into the electric charge accumulation layer. When the CVD method is employed, typically, fine particles or nanocrystals of approximately several nanometers in diameter can be included into the base material.

As has been described above, the essence of the principle of the present invention is to supply electrons from the donor layer or donor region to the electric charge accumulation layer, and extract trapped electrons which exist in the electric charge accumulation layer in the neutral state toward the substrate during erase operation, thus making it possible to realize a sufficiently negative threshold voltage.

Next, what kinds of material or element are suitable for donor atoms will be explained specifically.

Firstly, the material of the electric charge accumulation layer will be explained, since the choice of elements used as the donor atoms depends on the substance which constitutes the electric charge accumulation layer as the base material. In general, a silicon nitride film ($Si_3N_4$) is often used as the electric charge accumulation layer of the MONOS memory cell. Alternatively, as variations, there may be employed a Si-rich silicon nitride film or a silicon oxynitride film instead of the silicon nitride film. There may also be employed a germanium nitride film ($Ge_3N_4$) as a material that has characteristics similar to those of a silicon nitride film. The characteristics when the germanium nitride film is used are disclosed in Document 2 (T. Maeda, T. Yasuda, M. Nishizawa, N. Miyata and Y. Morita, "Ge metal-insulator-semiconductor structures with $Ge_3N_4$ dielectrics by direct nitridation of Ge substrate", Appl. Phys. Lett. 85, 3181 (2004))

There may also be employed a mixture or a compound with the germanium nitride film ($Ge_3N_4$) or silicon nitride film as the material of the electric charge accumulation layer. Other than this, as the material for the electric charge accumulation layer of the MONOS memory cell, there may be employed a material of gallium nitride (GaN) or a material of aluminum gallium nitride (AlGaN) type. As is disclosed in the Document 1, these materials have the band-alignment position shifted to the valence band direction relative to the silicon nitride film, and therefore have a deep energy level when in use as a trap/discharge layer for electrons. Accordingly, these materials are advantageous in data retention characteristics.

Next, donor atoms which should be used corresponding to these materials of the electric charge accumulation layer will be explained. In general, an element that is located on the right-hand side of the base element by one in the periodic table of elements can be the candidate for donor atoms. Furthermore, so as to introduce a large amount of donors into a base material without generating strains and defects, it is desired that base material atoms and donor atoms be replaced with atoms whose atomic radius and bond length are close to each other. Referring to the result of Document 3 (J. P. Goss, P. R. Briddon, M. J. Rayson, S. J. Sque and R. Jones, "Vacancy-impurity complexes and limitations for implantation doping of diamond", Phys. Rev. B 72, 035214 (2005)), Si, P, Ge, As, Al, Ga are atoms whose atomic radius and bond length are close to each other. Accordingly, it is considered that replacing these atoms mutually is convenient in increasing the donor concentration.

In Document 4 (F. Oba, K. Tatsumi, I. Tanaka, H. Adachi, J. American Ceramic Soc. 85, 97-100 (2002)), there are represented donor materials proven to be effective. That is, it is disclosed that, for a silicon nitride film ($Si_3N_4$), phosphorus (P) can be an n-type dopant (donor). Furthermore, it is disclosed that, for a germanium nitride film ($Ge_3N_4$), antimony (Sb) can be an n-type dopant (donor).

In Document 5 (W. Götz, N. M. Johnson, C. Chen, H. Liu, C. Kuo, and W. Imler, "Activation energies of Si donors in GaN", Appl. Phys. Lett. 68, 3144 (1996)), there is disclosed a report about donor materials for gallium nitride (GaN). That is, silicon doped into gallium nitride has a significantly shallow level, that is, an energy level which is lower than the conduction band edge by approximately 22 meV, and Si doping can generate free electrons of high concentration surpassing $10^{19}$ $cm^{-3}$.

The above-described contents are summarized as the cases represented in a table shown in FIG. 6. Furthermore, considering the function of the donor layer, its essential role is to supply electrons to the electric charge accumulation layer (trap layer)

Therefore, it is required that the energy level of donor electrons be higher than that of at least part of the traps in the electric charge accumulation layer. Accordingly, it is apparent that any kind of materials, including insulator, metal, or semiconductor, can be used as the donor layer, so long as the energy level requirement is satisfied. As a result, it is also considered that the similar effect can be brought about by forming an ultrathin metal layer as the donor layer to supply electrons from the metal layer to the electric charge accumulation layer. Accordingly, the case of using an ultrathin metal layer as the electron-supplying layer that works as the donor layer is also included in FIG. 6.

Hereinafter, details of the present invention will be explained with reference to embodiments shown in the drawings.

First Embodiment

As shown in FIG. 7, on the channel region of a p-type silicon substrate 101, there is formed a silicon oxynitride film (SiON) as a tunnel insulating film (first insulating film) 102. On the tunnel insulating film 102, a silicon nitride film ($Si_3N_4$) is formed as an electric charge accumulation layer 103. On the electric charge accumulation layer 103, a silicon nitride film ($Si_3N_4(P)$) containing n-type dopant impurity (phosphorus) is formed as a donor layer 104. On the donor layer 104, a lanthanum aluminate film ($LaAlO_3$) is formed as a block insulating film (second insulating film) 105. On the block insulating film 105, a tungsten nitride film is formed as a control gate electrode 106. On the control gate electrode 106, a tungsten film of low-resistance metal is formed as a conductive layer 107.

Taking into account the compatible realization of favorable write/erase and data retention characteristics, the thickness of SiON film as the tunnel insulating film 102 is set to approximately 4 nm (equivalent film thickness 3.4 nm) for the composition of $(SiO_2)_{0.8}(Si_3N_4)_{0.2}$. The thickness of $Si_3N_4$ film as the electric charge accumulation layer 103 is set to approximately 3 nm (equivalent film thickness 1.6 nm). The thickness of $Si_3N_4(P)$ film as the donor layer 104 is set to approximately 2 nm (equivalent film thickness 1.1 nm), and the concentration of phosphorus is set to $5 \times 10^{19}$ $cm^{-3}$. In this case, the donor density per unit area of approximately $1 \times 10^{13}$ $cm^{-2}$ can be obtained. To obtain a sufficient threshold voltageshift, the area density of n-type dopant impurity of the donor layer 104 is required to be $9 \times 10^{12}$ $cm^{-2}$ or more. The thickness of $LaAlO_3$ film as the block insulating film 105 is set to approximately 20 nm (equivalent film thickness 3.4 nm).

In this embodiment, a silicon oxynitride film is used as the tunnel insulating film 102, while a stacked tunnel insulating film of silicon-oxide-film/silicon-nitride-film/silicon-oxide-film (ONO film) may be employed instead. It is described, for example, in Document 6 (JP-A 2006-13003 (KOKAI)) that the ONO film is effective as the tunnel insulating film.

The silicon nitride film as the electric charge accumulation layer 103 does not necessarily have to be a $Si_3N_4$ film having the stoichiometric composition, and may be a silicon nitride film having the composition of Si rich so as to increase the trap density in the film. Furthermore, a $Ge_3N_4$ film having the characteristics similar to those of the $Si_3N_4$ film may be employed. There is a report in Document 2 that $Ge_3N_4$ is used as an insulating film of the MIS structure.

Furthermore, as the n-type dopant impurity in the donor layer 104, such atoms as arsenic, antimony, etc. may be used instead of phosphorous.

Furthermore, the lanthanum aluminate film as the block insulating film 105 may be made of other materials so long as the materials are provided with the function of suppressing the leak current between the control gate electrode 106 and the electric charge accumulation layer 103. For example, various materials may be employed such as aluminum oxide ($Al_2O_3$), aluminum oxynitride (AlON), hafnium dioxide ($HfO_2$), hafnium aluminate (HfAlOx), hafnium nitride aluminate (HfAlON), hafnium silicate (HfSiOx), hafnium nitride silicate (HfSiON), lanthanum-doped hafnium silicate (La-doped HfSiOx), hafnium lanthanum oxide (HfLaOx).

The metal material of the control gate electrode 106 may be selected by taking the work function and the reactivity with the block insulating film 105 into consideration, and can be replaced by various metals such as TaN, TiN, HfN, TaSiN, Ru, W, WSix, Ru, TaC, instead of WN. As for the low-resistance metal layer 107 arranged on the control gate electrode 106, WSi, NiSi, MoSi, TiSi, CoSi, etc. may be used instead of W.

The method of producing the memory cell shown in FIG. 7 will be explained with reference to FIG. 8A, FIG. 8B to FIG. 12A, and FIG. 12B. In FIG. 8A, FIG. 8B to FIG. 12A, and FIG. 12B, "A" shows a sectional view in the column direction, while "B" shows a sectional view in the row direction.

Firstly, as shown in FIG. 8A and FIG. 8B, on the silicon substrate (including well) 101 in which p-type impurity is doped, there is formed a tunnel oxide film of approximately 4 nm in thickness by performing the thermal oxidation. Then, by performing a plasma nitridation, the tunnel insulating film 102 is formed to be a silicon oxynitride film.

Then, by employing the CVD (chemical vapor deposition) method using dichlorosilane ($SiH_2Cl_2$) and ammonia ($NH_3$) as material gas, on the tunnel insulating film 102, the silicon nitride film (electric charge accumulation layer) 103 of approximately 3 nm in thickness is formed. Then, by employing the CVD method using, for example, dichlorosilane ($SiH_2Cl_2$), phosphine ($PH_3$), and ammonia ($NH_3$) as material gas, on the electric charge accumulation layer 103, a silicon nitride film containing phosphorus which functions as the donor layer 104 is formed.

Then, by employing the reactive sputtering method using a target made of La and Al, on the donor layer 104, the lanthanum aluminate film (block insulating film) 105 of approximately 20 nm in thickness is formed.

Then, by employing the sputtering method (including reactive sputtering method) using a target made of tungsten, on the block insulating film 105, the WN film (control gate electrode) 106 is formed.

Next, on the WN film 106, a mask material 111 for making the device isolation region is formed. Then, a photoresist is formed on the mask material 111, and the photoresist is exposed and developed. Then, by employing RIE (reactive ion etching) method, pattern of the photoresist is transcribed to the mask material 111. Then the photoresist is removed.

Next, as shown in FIG. 9A and FIG. 9B, with the mask material 111 working as the mask, by employing the RIE method, the conductive layer 107, control gate electrode 106, block insulating film 105, donor layer 104, electric charge accumulation layer 103, and tunnel insulating film 102 are etched sequentially. In this way, slits 112a for separating memory cells which are adjacent to each other in the row direction are formed. Subsequently, by employing the RIE method, the silicon substrate 101 is etched to form device isolation trenches 112b of approximately 100 nm in depth on the silicon substrate 101.

Figures 10A, 10B:
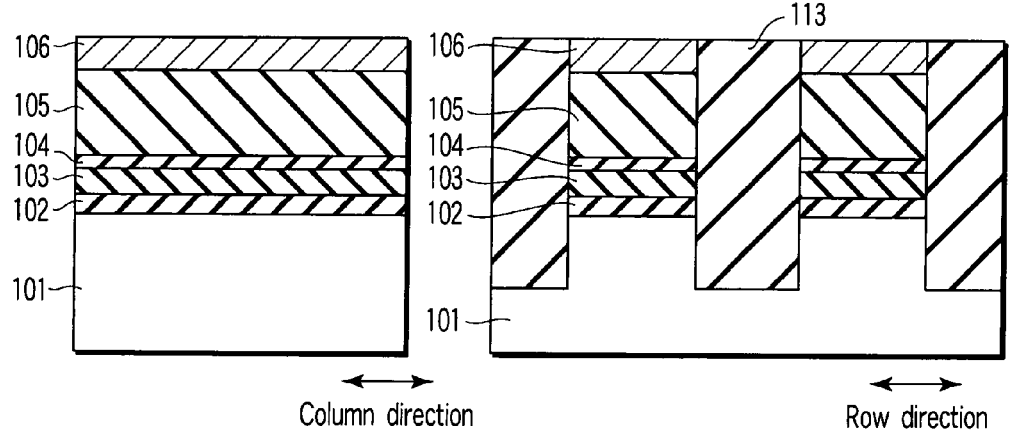
FIGS. 10A and 10B show sectional views indicative of a part of steps of producing the memory cell in the first embodiment.

Next, as shown in FIG. 10A and FIG. 10B, by employing the CVD method, silicon oxide films (buried oxide films) 113 are so formed as to completely fill in the slits 112a and device isolation trenches 112b. Subsequently, by employing the CMP method (Chemical Mechanical Polishing), the silicon oxide films 113 are polished until the mask material 111 is exposed, and the surfaces of the silicon oxide films 113 are planarized. Then, the silicon oxide films 113 are etched back using dilute fluorinated acid solution, and the height of the silicon oxide films 113 is adjusted to accord with the height of the WN film 106. It is noted that attention should be paid so as to prevent the overetching by the dilute fluorinated acid solution. Then, the mask material 111 is selectively removed.

Figures 11A, 11B:
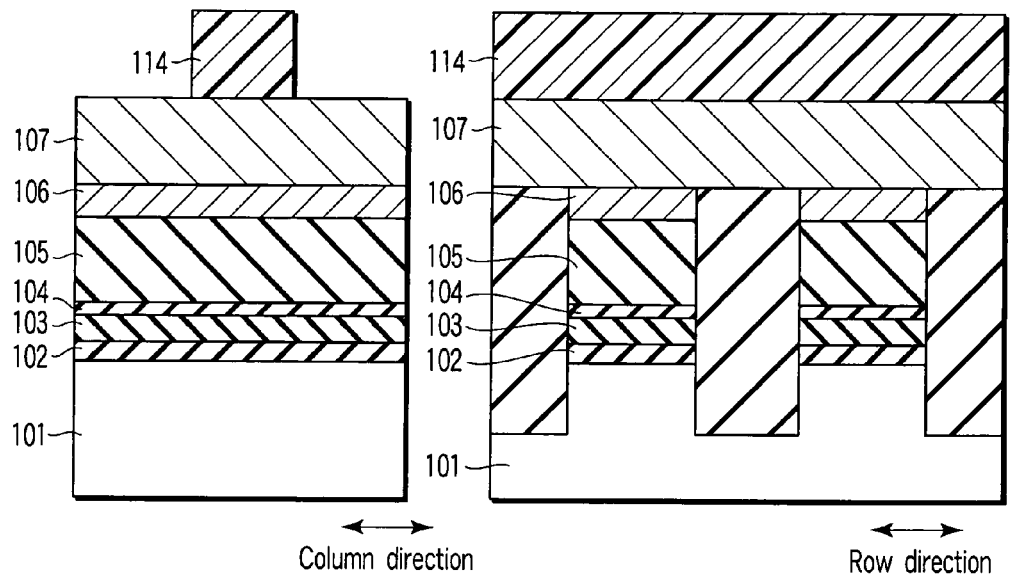
FIGS. 11A and 11B show sectional views indicative of a part of steps of producing the memory cell in the first embodiment.

Next, as shown in FIG. 11A and FIG. 11B, by employing the CVD method, on the WN film (control gate electrode) 106, the conductive layer (word line) 107 made of, for example, tungsten of approximately 100 nm in thickness is formed.

Subsequently, by employing the CVD method, a mask material 114 is formed on the conductive layer 107. Then, a photoresist is formed on the mask material 114, and the photoresist is exposed and developed. Then, by employing the RIE method, the pattern of the photoresist is transcribed to the mask material 114. Then, the photoresist is removed.

Figures 12A, 12B:
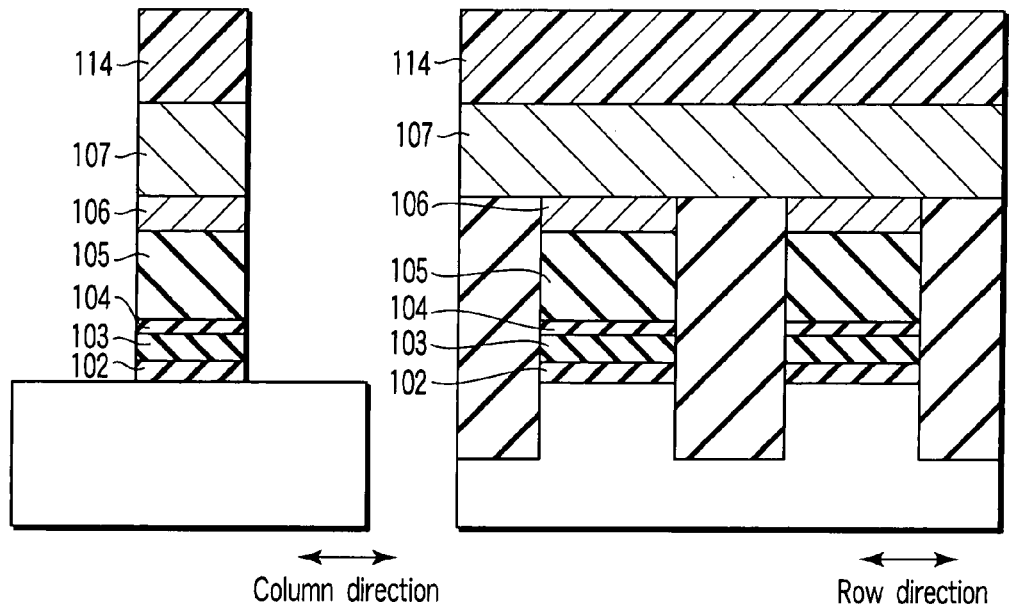
FIGS. 12A and 12B show sectional views indicative of a part of steps of producing the memory cell in the first embodiment.

Next, as shown in FIG. 12A and FIG. 12B, with the mask material 114 working as the mask, by employing the RIE method, the conductive layer 107, WN film 106, block insulating film 105, donor layer 104, electric charge accumulation layer 103, and tunnel insulating film 102 are etched sequentially. In this way, the shape of the MONOS gate stack structures can be formed.

After that, by employing the CVD method, after performing the processing of forming silicon oxide films on the sides of the MONOS gate stack structures, and by employing the ion implantation method and self-aligned technology, $n^+$-type source/drain diffusion layers 108 are formed on the surface region of the silicon substrate 101. Accordingly, the memory cells are completed. Finally, an interlayer insulating film, not shown, is formed to cover the memory cells by the CVD method.

The production method in this embodiment is merely an example, and the memory cell shown in FIG. 7 may be formed by employing other production methods. For example, concerning material gas used in the CVD method, other kinds of gas can be used instead. Furthermore, the sputtering method can be replaced with the CVD method. For example, details of the CVD method to form a lanthanum aluminate film are described in Document 7 (A. -D. Li, Q. -Y. Shao, H. -Q. Ling, J. -B. Cheng, D Wu, Z. -G. Liu, N. -B. Ming, C Wang, H. -W. Zhou, and B. -Y. Nguyen, "Characteristics of $LaAlO_3$ gate dielectrics on Si grown by metalorganic chemical vapor deposition", Appl. Phys. Lett. 83, 3540 (2003)). Moreover, the above-described respective layers can be formed by employing evaporation methods other than the CVD method and sputtering method, and the laser ablation method, MBE method, or methods combining those methods.

As has been described above, according to the embodiment, since the donor layer 104 being a silicon nitride film containing phosphorus is formed between the electric charge accumulation layer 103 being a silicon nitride film and the block insulating film 105 being a lanthanum aluminate film, electrons emitted from donor atoms in the donor layer 104 can be captured by traps in the electric charge accumulation layer 103, which occurs in the electrically neutral state. Accordingly, in the erase operation of the memory cell, the electrons can be extracted toward the silicon substrate 101 side through the tunnel insulating film 102, which can realize a large negative threshold voltage in the erased state. As a result, not only the Vth after writing data can be made sufficiently large similar to the conventional MONOS, but also a sufficiently large negative Vth can be obtained as the threshold voltage after erase operation.

That is, the threshold voltages of the memory cells in this embodiment after writing and erasing data can correspond to threshold voltages that are required in the operation of a NAND flash memory and therefore the memory cells in this embodiment can be effectively used as those of a NAND flash memory.

Second Embodiment

The point of the second embodiment which is different from the first embodiment is that, instead of forming a donor layer, donor atoms for supplying electrons are contained the electric charge accumulation layer, and thus the electric charge accumulation layer also works as a donor layer.

Figure 13:
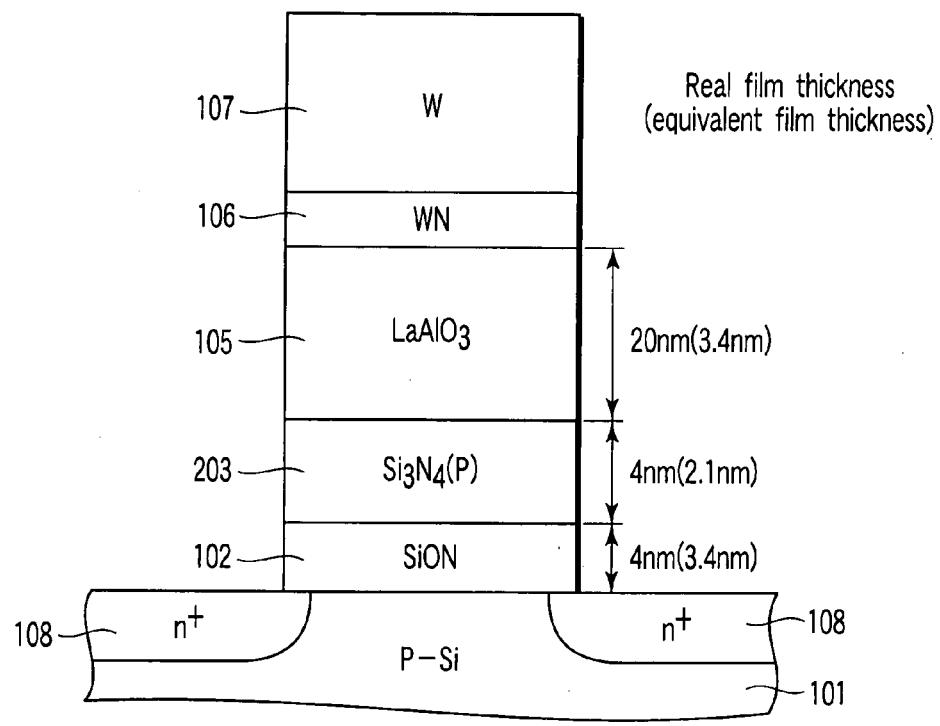
FIG. 13 shows a sectional view to explain the detailed structure of the memory cell along the channel length direction according to a second embodiment.

As shown in FIG. 13, on the channel region of the p-type silicon substrate 101, there is formed a silicon oxynitride film (SiON) as the tunnel insulating film (first insulating film) 102. On the tunnel insulating film 102, a silicon nitride film ($Si_3N_4$ (P)) containing n-type dopant impurity (phosphorus) is formed as an electric charge accumulation layer combined with donor layer (donor-containing electric charge accumulation layer) 203. On the electric charge accumulation layer combined with donor layer 203, a lanthanum aluminate film ($LaAlO_3$) is formed as the block insulating film (second insulating film) 105. On the block insulating film 105, a tungsten nitride film is formed as the control gate electrode 106. On the control gate electrode 106, a tungsten film of low-resistance metal is formed as the conductive layer 107.

The thickness of $Si_3N_4(P)$ film as the electric charge accumulation layer combined with donor layer 203 is set to approximately 4 nm (equivalent film thickness 2.1 nm), and the concentration of phosphorus is set to $2.5 \times 10^{19}$ $cm^{-3}$. In this case, the area density of donor atoms of approximately $1 \times 10^{13}$ $cm^{-2}$ can be obtained.

The silicon nitride film as the base material of the electric charge accumulation layer combined with donor layer 203 does not necessarily have to be a $Si_3N_4$ film having the stoichiometric composition, and may be a silicon nitride film having the composition of Si rich so as to increase the trap density in the film. Furthermore, a $Ge_3N_4$ film having the characteristics similar to those of the $Si_3N_4$ film may be employed, and a compound or a mixture of $Si_3N_4$ and $Ge_3N_4$ may be used. Moreover, the $Si_3N_4$ film or $Ge_3N_4$ film may be replaced with an impure nitride film, that is, a silicon oxynitride film or a germanium oxynitride film that has a small amount of oxygen and has its nitrogen concentration set high may be alternatively used.

Furthermore, in the electric charge accumulation layer combined with donor layer 203, instead of phosphorus as the dopant impurity, arsenic, antimony, etc. may be employed.

The composition and thickness of SiON film as the tunnel insulating film 102 and the thickness of $LaAlO_3$ film as the block insulating film 105 are set up similarly as the first embodiment. Moreover, similar to the first embodiment, as the tunnel insulating film 102, films other than the silicon oxynitride film can be used.

Furthermore, the material of the block insulating film 105 is not restricted to lanthanum aluminate, and variations similar to those in the first embodiment may be employed. Moreover, as for the material of the control gate electrode 106 and the low-resistance metal layer 107 formed thereon, variations similar to those in the first embodiment may be employed.

Concerning the method of producing the memory cell shown in FIG. 13, basically, the process in the first embodiment (FIG. 8A, FIG. 8B to FIG. 12A, and FIG. 12B) can be employed without modification. Hereinafter, steps which are different from those in the first embodiment will be explained.

Steps until the tunnel insulating film 102 is formed are similar to those in the first embodiment, and thereafter the electric charge accumulation layer combined with donor layer 203 is formed.

The silicon nitride film containing phosphorus being the electric charge accumulation layer combined with donor layer 203 is formed by employing the CVD method using dichlorosilane ($SiH_2Cl_2$), phosphine ($PH_3$), and ammonia ($NH_3$) as material gas. Otherwise, as is described in Document 8 (H.-P. Baldus, W. Schnick, J. Lucke, U. Wannagat and G. Bogedain, Chem. Mater. Vol. 5, pp. 845-850 (1993)), the $Si_3N_4(P)$ film can be formed by the reaction using $Cl_3Si$—N=$PCl_3$ and $NH_3$.

Other than this, the silicon nitride film containing phosphorus being the electric charge accumulation layer combined with donor layer 203 is formed by employing the CVD method using dichlorosilane ($SiH_2Cl_2$) and ammonia ($NH_3$) as material gas to form a silicon nitride film, and then by ion-implanting phosphorus with ultra-low energy into thus formed silicon nitride film.

After that, similar to the first embodiment, the block insulating film 105, control gate electrode 106, and conductive layer 107 made of low-resistance metal are formed.

According to the second embodiment, the electric charge accumulation layer combined with donor layer 203 is provided with the function of the electric charge accumulation layer 103 as well as the function of the donor layer 104 in the first embodiment. Accordingly, similar to the first embodiment, in the erase operation of the memory cell, the electrons can be extracted toward the silicon substrate 101 side through the tunnel insulating film 102, which can realize a large negative threshold voltage in erasing. Accordingly, an effect similar to that in the first embodiment can be obtained.

Figure 14:
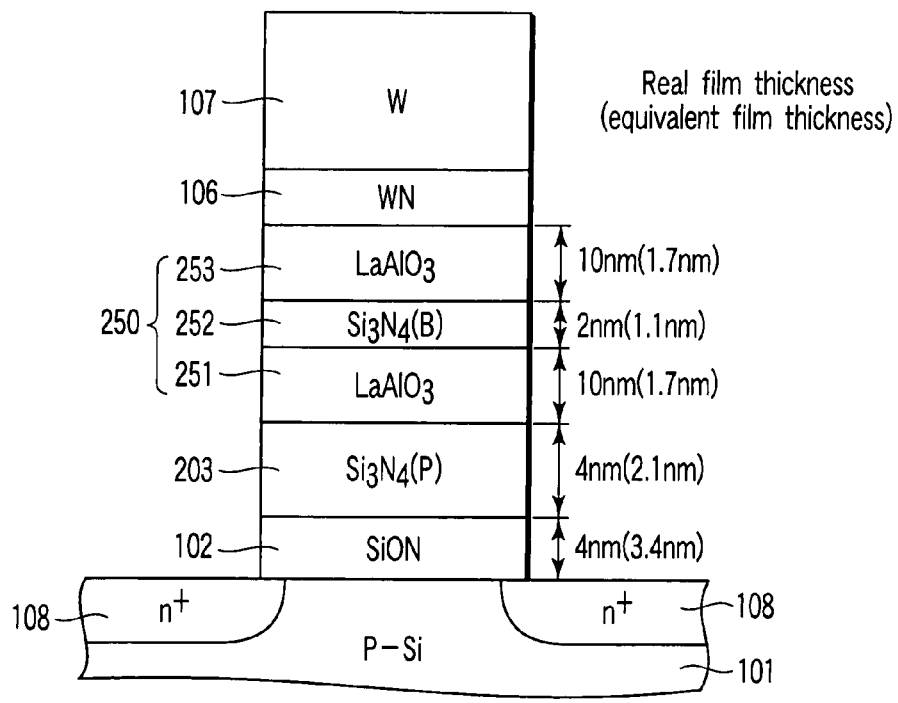
FIG. 14 shows a sectional view indicative of the detailed structure of the memory cell according to a variation of the second embodiment.

As a variation of the second embodiment, there may be employed a structure shown in FIG. 14. In this variation, only the structure of the block insulating film is different from that in the second embodiment shown in FIG. 13. In this variation, there is employed a block insulating film 250 that includes three layers of a lanthanum aluminate film 251 ($LaAlO_3$), a boron-doped silicon nitride film 252 ($Si_3N_4(B)$), and a lanthanum aluminate film 253 ($LaAlO_3$).

The thickness of $LaAlO_3$ films which configure the lower layer and upper layer of the block insulating film 250 is set to approximately 10 nm (equivalent film thickness 1.7 nm) respectively. The thickness of the boron-doped silicon nitride film 252 is set to approximately 2 nm (equivalent film thickness 1.1 nm). The boron-doped silicon nitride film 252 works as a layer to accumulate negative fixed electric charges, and reduces the electric field induced at both end interfaces of the block insulating film 250 in the writing or erasing operation of the memory cell, thereby decreasing the leak current. Details are described in Document 9 (JP-A 2004-363329 (KOKAI)).

Concerning the method of producing the memory cell shown in FIG. 14, basically, the process in the second embodiment can be directly employed. Hereinafter, steps of producing the block insulating film 250 which are different from those in the second embodiment will be explained.

On the electric charge accumulation layer combined with donor layer 203, by employing the reactive sputtering method using a target made of La and Al, the lanthanum aluminate film 251 of approximately 10 nm in thickness is formed. Then, by employing the CVD method using dichlorosilane ($SiH_2Cl_2$), diborane ($B_2H_6$), and ammonia ($NH_3$) as material gas, on the lanthanum aluminate film 251, the silicon nitride film 252 containing boron is formed. In forming the silicon nitride film 252 containing boron, there may be employed another method of, after forming a $Si_3N_4$ film by employing the CVD method firstly, ion-implanting boron ($B^+$) or $BF_2^+$ into the $Si_3N_4$ film with ultra-low energy. Then, on the boron-doped silicon nitride film 252, by employing the reactive sputtering method using a target made of La and Al again, the lanthanum aluminate film 253 of approximately 10 nm in thickness is formed.

According to the variation, not only an effect similar to that in the second embodiment can be obtained, but also the leak current can be reduced since the block insulating film 250 is made to include three layers.

Third Embodiment

The point of the third embodiment which is different from the first embodiment is that, instead of forming a donor layer, fine particles or nanocrystals of silicon in which phosphorus is doped are formed in the silicon nitride film as the electric charge accumulation layer. By forming such fine particles, the coulomb blockade effect and quantum confinement effect appear, and the energy level of donor is made high, from which the improvement of ionization efficiency of donor can be expected.

Figure 15:
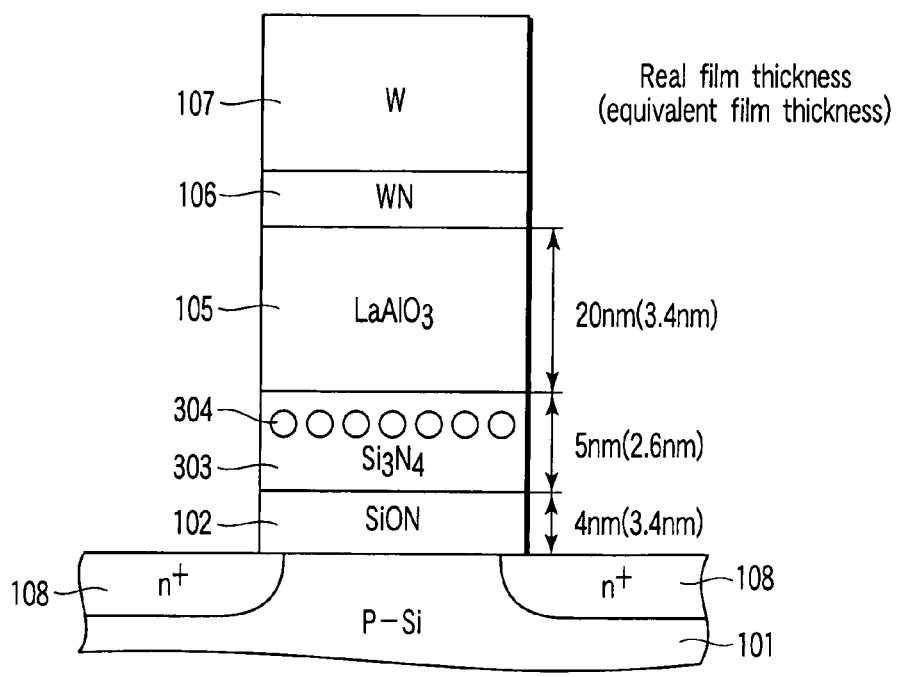
FIG. 15 shows a sectional view indicative of the detailed structure of the memory cell according to a third embodiment.

As shown in FIG. 15, on the channel region of the p-type silicon substrate 101, there is formed a silicon oxynitride film (SiON) as the tunnel insulating film (first insulating film) 102. On the tunnel insulating film 102, a silicon nitride film ($Si_3N_4$) is formed as an electric charge accumulation layer 303. In the electric charge accumulation layer 303, silicon fine particles (Si(P)) 304 containing n-type dopant impurity (phosphorus) are formed. On the silicon nitride film (electric charge accumulation layer containing donor in the form of fine particles) 303 containing the fine particles 304, a lanthanum aluminate film ($LaAlO_3$) is formed as the block insulating film (second insulating film) 105. On the block insulating film 105, a tungsten nitride film is formed as the control gate electrode 106. On the control gate electrode 106, a tungsten film of low-resistance metal is formed as the conductive layer 107.

The thickness of $Si_3N_4$ film as the electric charge accumulation layer 303 is set to approximately 5 nm (equivalent film thickness 2.6 nm). In the silicon fine particles 304, the average concentration of phosphorus is set to $3 \times 10^{20}$ cm$^{-3}$.

The silicon nitride film as the electric charge accumulation layer 303 does not necessarily have to be a $Si_3N_4$ film having the stoichiometric composition, and may be a silicon nitride film having the composition of Si rich. Moreover, the $Si_3N_4$ film may be replaced with an impure nitride film, that is, a silicon oxynitride film that has a small amount of oxygen and has its nitrogen concentration set high may be alternatively used. Furthermore, instead of the silicon nitride film ($Si_3N_4$), a germanium nitride film ($Ge_3N_4$) or an aluminum gallium nitride film (AlGaN) can be used.

Furthermore, in the fine particles 304 containing donor atoms, instead of phosphorus as the dopant impurity, arsenic, antimony, etc. may be employed.

The composition and thickness of SiON film as the tunnel insulating film 102 and the thickness of $LaAlO_3$ film as the block insulating film 105 are set up similarly as the first embodiment. Moreover, similar to the first embodiment, as the tunnel insulating film 102, films other than the silicon oxynitride film can be used.

Furthermore, as the tunnel insulating film 102, other than a silicon oxynitride film and an ONO film, an insulating film having silicon nanocrystals contained in the middle portion thereof may be used. Details are described in Document 10 (Ryuji Ohba, Yuichiro Mitani, Naoharu Sugiyama and Shinobu Fujita, "35 nm Floating Gate Planar MOSFET Memory using Double Junction Tunneling", IEDM Tech. Dig. pp. 873-876 (2005)) and Document 11 (Ryuji Ohba, Yuichiro Mitani, Naoharu Sugiyama and Shinobu Fujita, "Impact of Stoichiometry Control in Double Junction Memory on Future Scaling" IEDM Tech. Dig. pp. 897-900 (2004)).

Furthermore, the material of the block insulating film 105 is not restricted to lanthanum aluminate, and variations similar to those in the first embodiment may be employed. Moreover, as for the material of the control gate electrode and the low-resistance metal layer formed thereon, variations similar to those in the first embodiment can be employed.

Concerning the method of producing the memory cell shown in FIG. 15, basically, the process in the first embodiment (FIG. 8A, FIG. 8B to FIG. 12A, and FIG. 12B) can be employed without modification. Hereinafter, steps which are different from those in the first embodiment will be explained.

Steps until the tunnel insulating film 102 is formed are similar to those in the first embodiment, and then the electric charge accumulation layer 303 is formed.

Firstly, the silicon nitride film being the electric charge accumulation layer 303 is formed by employing the CVD method using dichlorosilane ($SiH_2Cl_2$) and ammonia ($NH_3$) as material gas, and has its film thickness set to approximately 3 nm. Then, the silicon fine particles are formed by employing the CVD method under low temperature for a short time period using silane ($SiH_4$) and phosphine ($PH_3$) as material gas. Detailed conditions are pursuant to those implemented in Document 10 and Document 11. Subsequently, a silicon nitride film of approximately 2 nm in film thickness is further formed by employing the CVD method using dichlorosilane ($SiH_2Cl_2$) and ammonia ($NH_3$) as material gas.

After that, similar to the first embodiment, the block insulating film 105, control gate electrode 106, and conductive layer 107 made of low-resistance metal are formed.

According to the third embodiment, the electric charge accumulation layer 303 containing donor in the form of fine particles is provided with the function of the electric charge accumulation layer 103 as well as the function of the donor layer 104 in the first embodiment. Accordingly, similar to the first embodiment, in the erase operation of the memory cell, electrons can be extracted toward the silicon substrate 101 side through the tunnel insulating film 102, which can realize a large negative threshold voltage in erasing data. Accordingly, an effect similar to that in the first embodiment can be obtained.

Fourth Embodiment

The point of the fourth embodiment is that a region that is high in trap density is formed around the upper surface of the silicon nitride film as the electric charge accumulation layer. This structure is employed so as to improve the efficiency of the transferring of electrons from donors of the silicon nitride film into which phosphorus is doped to traps of the electric charge accumulation layer.

Figure 16:
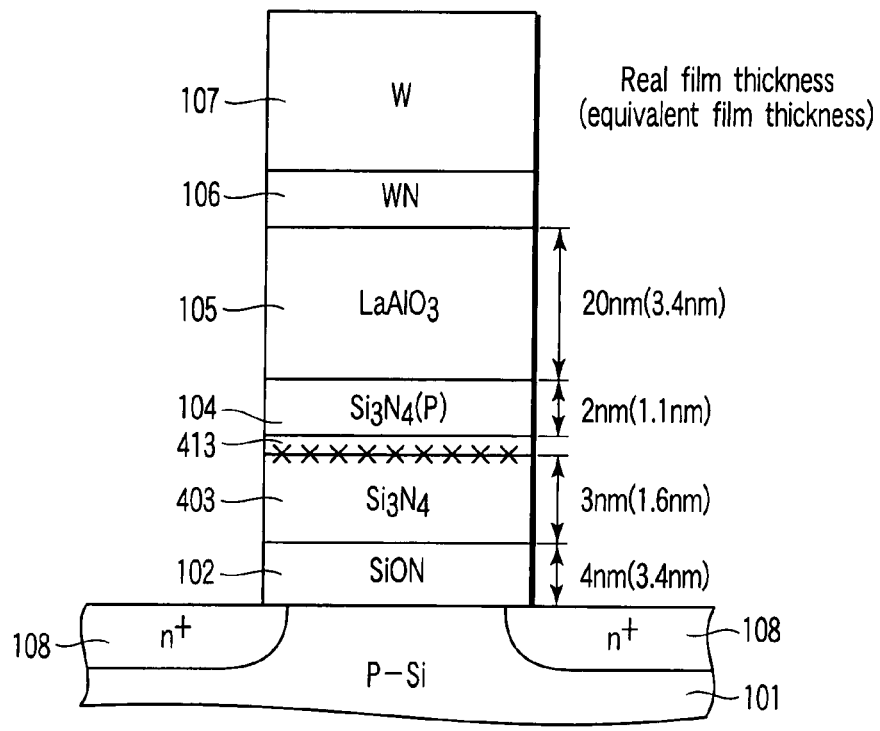
FIG. 16 shows a sectional view indicative of the detailed structure of the memory cell according to a fourth embodiment.

As shown in FIG. 16, on the channel region of the p-type silicon substrate 101, there is formed a silicon oxynitride film (SiON) as the tunnel insulating film (first insulating film) 102. On the tunnel insulating film 102, a silicon nitride film ($Si_3N_4$) is formed as an electric charge accumulation layer 403. On the upper surface of the electric charge accumulation layer 403, there exists an ultrathin silicon thermally-oxidized film 413 that is formed by performing the thermal oxidation processing for the silicon nitride film as the electric charge accumulation layer 403. Around the interface of the silicon nitride film as the electric charge accumulation layer 403 and the silicon thermally-oxidized film 413, defects being traps are formed with a high density. Furthermore, on the ultrathin silicon thermally-oxidized film 413, a silicon nitride film containing n-type dopant impurity (phosphorus) is formed as the donor layer 104. On the donor layer 104, a lanthanum aluminate film ($LaAlO_3$) is formed as the block insulating film (second insulating film) 105. On the block insulating film 105, a tungsten nitride film (WN) is formed as the control gate electrode 106. On the control gate electrode 106, a tungsten film of low-resistance metal is formed as the conductive layer 107.

The thickness of $Si_3N_4$ film as the electric charge accumulation layer 403 is set to approximately 3 nm (equivalent film thickness 1.6 nm). The thickness of the ultrathin silicon thermally-oxidized film 413 formed on the electric charge accumulation layer 403 is set to be smaller than 1 nm. The silicon nitride film as the electric charge accumulation layer 403 does not necessarily have to be a $Si_3N_4$ film having the stoichiometric composition, and may be a silicon nitride film having the composition of Si rich. Moreover, the $Si_3N_4$ film may be replaced with an impure nitride, that is, a silicon oxynitride film that has a small amount of oxygen and has its nitrogen concentration set high may be alternatively used.

The composition and thickness of SiON film as the tunnel insulating film 102, the thickness and phosphorus concentration of the silicon nitride film as the donor layer 104 into which phosphorus is doped, and the thickness of $LaAlO_3$ film as the block insulating film 105 are set up similarly as the first embodiment. Moreover, similar to the first embodiment, as the tunnel insulating film 102, films other than the silicon oxynitride film can be used.

Furthermore, in the silicon nitride film containing donor atoms, instead of phosphorus as the dopant impurity, arsenic, antimony, etc. may be employed. Furthermore, the material of the block insulating film 105 is not restricted to lanthanum aluminate, and variations similar to those in the first embodiment may be employed. Moreover, as for the material of the control gate electrode 106 and the low-resistance metal layer 107 formed thereon, variations similar to those in the first embodiment may be employed.

Concerning the method of producing the memory cell shown in FIG. 16, basically, the process in the first embodiment (FIG. 8A, FIG. 8B to FIG. 12A, and FIG. 12B) can be employed without modification. Hereinafter, steps which are different from those in the first embodiment will be explained.

Steps until the tunnel insulating film 102 is formed are similar to those in the first embodiment, and then the electric charge accumulation layer 403 is formed.

The silicon nitride film being the electric charge accumulation layer 403 is formed by employing the CVD method using dichlorosilane ($SiH_2Cl_2$) and ammonia ($NH_3$) as material gas, and has its film thickness set to approximately 4 nm. Then, the thermal oxidation processing is performed under the RTO (rapid thermal oxidation) of 900° C. for 60 sec. Thus, the upper surface of the silicon nitride film is oxidized to form the ultrathin silicon thermally-oxidized film 413 of approximately 1 nm in thickness, and defects are generated around the interface of the silicon nitride film and the silicon thermally-oxidized film. At this time, the silicon nitride film has its film thickness reduced to 3 nm. This thermal oxidation processing may be replaced with the wet oxidization processing in which hydrogen is supplied under reduced pressure, or the plasma oxidation processing under reduced pressure.

Document 12 (E. Suzuki, Y. Hayashi, K. Ishii and T. Tsuchiya, "Traps created at the interface between the nitride and the oxide on the nitride by thermal oxidation", Appl. Phys. Lett. 42, 608 (1983)) describes that a large amount of interface defects can be generated by oxidizing a silicon nitride film.

Subsequently, similar to the first embodiment, the donor layer 104, block insulating film 105, control gate electrode 106, and conductive layer 107 made of low-resistance metal are formed.

The production method in this embodiment is merely an example, and the memory cell shown in FIG. 16 may be formed by employing other production methods. For example, concerning material gas used in the CVD method, other kinds of gas can be used instead. For example, in the CVD method to form a silicon nitride film being the electric charge accumulation layer 403, instead of using dichlorosilane ($SiH_2Cl_2$) and ammonia ($NH_3$) as material gas, silane ($SiH_4$) and ammonia ($NH_3$) may be used as material gas.

Furthermore, in forming the block insulating film and metal electrode, the CVD method may be employed instead of the sputtering method.

According to the fourth embodiment, in addition to the structure of the first embodiment, the ultrathin silicon thermally-oxidized film 413 is formed on the silicon nitride film as the electric charge accumulation layer 403, and a region of high trap density is formed around the upper surface of the silicon nitride film. Accordingly, not only an effect similar to that in the first embodiment can be obtained, but also the efficiency of the transferring of electrons from the donor layer 104 to the traps of the electric charge accumulation layer 403 can be improved.

Fifth Embodiment

The point of the fifth embodiment is that material of AlGaN type is used for the electric charge accumulation layer and donor layer. GaN, whose band alignment (from conduction band to valence band) is located at a deep energy position, is advantageous as an electric charge accumulation layer. It is known that silicon doped into GaN has a significantly shallow donor level, and GaN is high in ionization rate of donor. Details of the energy level of donors of Si in GaN are described in Document 5. Furthermore, AlN is advantageous from the viewpoint of adjusting the energy position of band alignment and withstanding high electric field by the insulating film. Accordingly, by employing AlGaN, an electric charge accumulation layer and a donor layer provided with the above-described characteristics can be realized.

Figure 17:
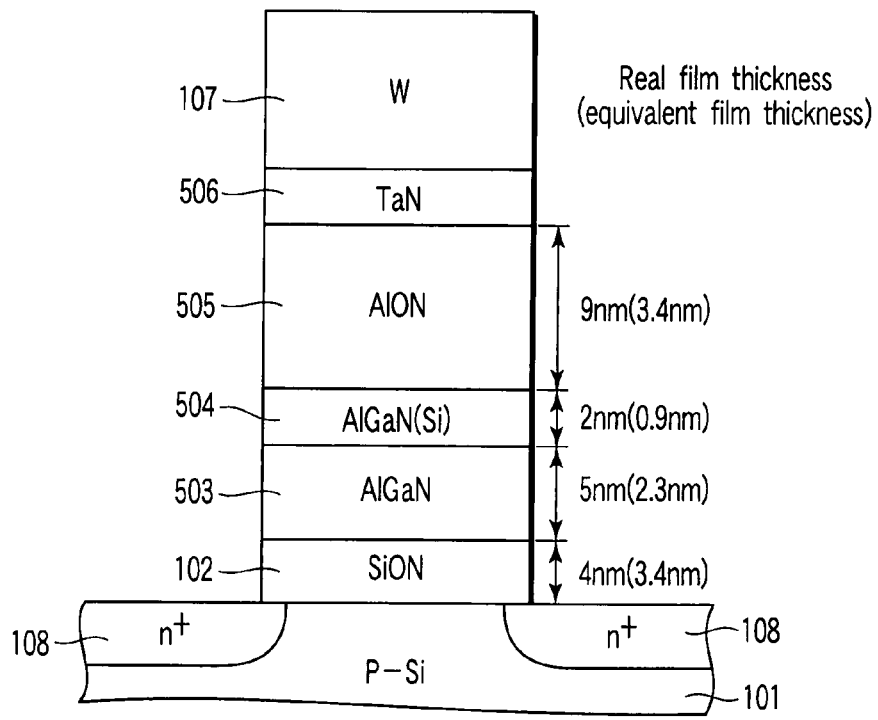
FIG. 17 shows a sectional view indicative of the detailed structure of the memory cell according to a fifth embodiment.

As shown in FIG. 17, on the channel region of the p-type silicon substrate 101, there is formed a silicon oxynitride film (SiON) as the tunnel insulating film (first insulating film) 102. On the tunnel insulating film 102, an aluminum gallium nitride film (AlGaN) is formed as an electric charge accumulation layer 503. On the electric charge accumulation layer 503, an aluminum gallium nitride film containing silicon (Si) atoms as n-type dopant impurity is formed as a donor layer 504. On the donor layer 504, an aluminum oxynitride film (AlON) is formed as a block insulating film (second insulating film) 505. On the block insulating film 505, a tantalum nitride film (TaN) is formed as a control gate electrode 506. On the control gate electrode 506, a tungsten film (W) of low-resistance metal is formed as the conductive layer 107.

The composition of the AlGaN film as the electric charge accumulation layer 503 is set to $(AlN)_{0.4}(GaN)_{0.6}$, and the film thickness thereof is set to approximately 5 nm (equivalent film thickness 2.3 nm). Furthermore, the composition of the AlGaN film as the base material of the donor layer 504 into which Si is doped is set to $(AlN)_{0.6}(GaN)_{0.4}$, and the film thickness thereof is set to approximately 2 nm (equivalent film thickness 0.9 nm). The concentration of phosphorus in the donor layer 504 is set to approximately $5 \times 10^{19}$ cm$^{-3}$. Accordingly, the area density of phosphorus comes to be approximately $1 \times 10^{13}$ cm$^{-2}$. The thickness of AlON film as the block insulating film 505 is set to approximately 9 nm (equivalent film thickness 3.4 nm).

The composition of the AlGaN film as the electric charge accumulation layer 503 is not necessarily restricted to that of the present invention. It is desired that the electric charge accumulation layer 503 have its amount of Ga made larger than Ga of AlGaN of the donor layer 504, and have its band alignment located at a deep energy position. The electric charge accumulation layer 503 does not necessarily have to be an AlGaN film having the stoichiometric composition. For example, the electric charge accumulation layer 503 may be made of AlGaN that has its Al amount slightly made large as compared with the stoichiometric composition, or may be an AlGaON layer containing a small amount of oxygen. Furthermore, silicon that works as donor impurity atoms in AlGaN of the donor layer 504 may be replaced with a fourth group element such as Ge.

Moreover, aluminum oxynitride (AlON) used for the block insulating film 505 may be replaced with material such as lanthanum aluminate (LaAlO$_3$), aluminum oxide (Al$_2$O$_3$), hafnium dioxide (HfO$_2$), hafnium aluminate (HfAlOx), hafnium nitride aluminate (HfAlON), hafnium silicate (HfSiOx), hafnium nitride silicate (HfSiON), lanthanum nitride aluminate (LaAlON), lanthanum-doped hafnium silicate (La-doped HfSiOx), hafnium lanthanum oxide (HfLaOx).

The metal material of the control gate electrode 506 can be replaced by various metals such as TiN, HfN, TaSiN, Ru, W, WSix, WN, Ru, TaC, instead of TaN. As for the low-resistance metal layer 107 arranged on the control gate electrode 506, WSi, NiSi, MoSi, TiSi, CoSi, etc. may be used instead of W.

The composition and thickness of SiON film as the tunnel insulating film 102 is set up similarly as the first embodiment. Moreover, similar to the first embodiment, as the tunnel insulating film 102, films other than the silicon oxynitride film can be used.

Concerning the method of producing the memory cell shown in FIG. 17, basically, the process in the first embodiment (FIG. 8A, FIG. 8B to FIG. 12A, and FIG. 12B) can be directly employed. Hereinafter, steps which are different from those in the first embodiment will be explained.

Steps until the tunnel insulating film 102 is formed are similar to those in the first embodiment, and then the electric charge accumulation layer 503 is formed. AlGaN used for the electric charge accumulation layer 503 is formed by employing the CVD method using organic gallium (Ga(CH$_3$)$_3$), organic aluminum (Al(CH$_3$)$_3$), and ammonia (NH$_3$) as a source material. Furthermore, AlGaN used for the donor layer 504 into which silicon is doped is formed by employing the CVD method using organic gallium (Ga(CH$_3$)$_3$), organic aluminum (Al(CH$_3$)$_3$), silane (SiH$_4$), and ammonia (NH$_3$) as a source material.

Then, on the donor layer 50, the AlON film as the block insulating film 505 is formed by employing the CVD method or ALD method arbitrarily using organic aluminum (Al(CH$_3$)$_3$), ammonia (NH$_3$), and water (H$_2$O) as a source material.

Next, a TaN/W layered film as the control gate electrode 506 and conductive layer 107 made of low-resistance metal is formed by employing the reactive sputtering method using a target made of tantalum, and the sputtering method in inactive gas using a target made of tungsten.

The production method in this embodiment is merely an example, and the memory cell shown in FIG. 17 may be formed by employing other production methods. For example, concerning material gas used in the CVD method, other kinds of gas can be used instead. Furthermore, the CVD method or ALD method can be replaced with the sputtering method. For example, the TaN film as the control gate electrode 506 may be formed by employing the CVD method or ALD method using Ta(N(CH$_3$)$_2$)$_5$ and NH$_3$ as material gas instead of the sputtering method. Moreover, the above-described respective layers can be formed by employing evaporation methods other than the ALD method, CVD method, and sputtering method, the laser ablation method, MBE method, or methods combining those methods.

As has been described above, according to the embodiment, since the donor layer 504 being an aluminum gallium nitride film containing silicon is formed between the electric charge accumulation layer 503 being an aluminum gallium nitride film and the block insulating film 505 being an aluminum oxynitride film, electrons emitted from donor atoms in the donor layer 504 in the electrically neutral bias condition can be captured by traps in the electric charge accumulation layer 503. Accordingly, similar to the first embodiment, in the erase operation of the memory cell, the electrons can be extracted toward the silicon substrate 101 side through the tunnel insulating film 102, which can realize a sufficiently large negative threshold voltage in the erased state.

Figure 18:
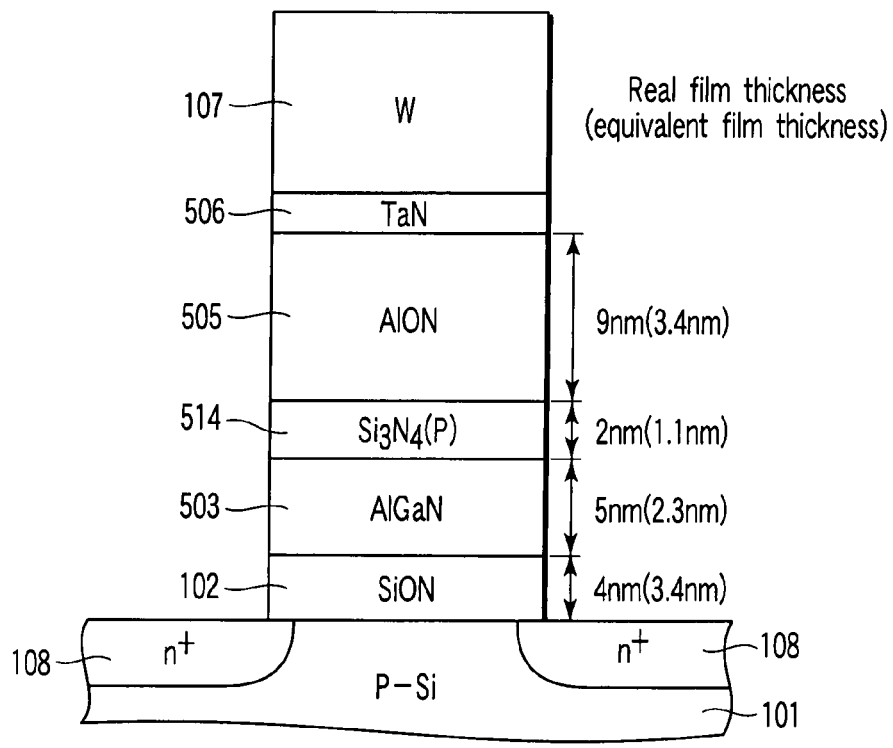
FIG. 18 shows a sectional view indicative of the detailed structure of the memory cell according to a variation of the fifth embodiment.

As a variation of the fifth embodiment, there may be employed a structure shown in FIG. 18. In this variation, the donor layer in the fifth embodiment is replaced with a silicon nitride film into which phosphorus is doped.

On the aluminum gallium nitride film (AlGaN) as the electric charge accumulation layer 503, a silicon nitride film containing phosphorus is formed as a donor layer 514. The film thickness of the donor layer 514 is set to approximately 2 nm (equivalent film thickness 1.1 nm), and the concentration of phosphorus in the donor layer 514 is set to approximately $5 \times 10^{19}$ cm$^{-3}$. Accordingly, the area density of phosphorus comes to be approximately $1 \times 10^{13}$ cm$^{-2}$. In the donor layer 514, phosphorus working as donor impurity may be replaced with a fifth group element such as arsenic, antimony, etc.

The point of the method of producing the memory cell shown in FIG. 18 which is different from the fifth embodiment is that the silicon nitride film as the donor layer 514 into which phosphorus is doped is formed by employing the CVD method using dichlorosilane (SiH$_2$Cl$_2$), ammonia (NH$_3$), and phosphine (PH$_3$) as a source material. The production method in this embodiment is merely an example, and the memory cell shown in FIG. 18 may be formed by employing other production methods.

Under this structure, an effect similar to that in the fifth embodiment can be surely obtained.

Sixth Embodiment

The point of the sixth embodiment is that a layer that works as an electric charge accumulation layer as well as a donor layer is made from a material of AlGaN type. Note that GaN, whose band alignment (from conduction band to valence band) is located at a deep energy position, is advantageous as an electric charge accumulation layer. Since silicon that is doped into GaN has a significantly shallow donor level, the advantage that ionization rate of donor is high can be obtained. Furthermore, being used in the form of AlGaN, which is a compound of GaN with AlN, adjusting the energy position of band alignment and withstanding high electric field by the electric charge accumulation layer combined with donor layer can be realized.

Figure 19:
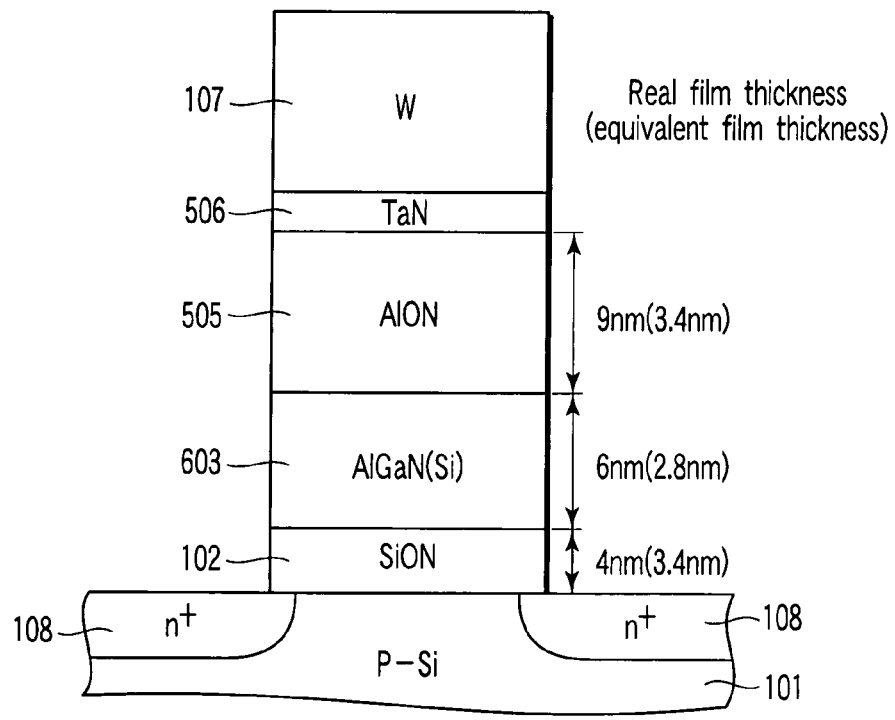
FIG. 19 shows a sectional view indicative of the detailed structure of the memory cell according to a sixth embodiment.

As shown in FIG. 19, on the channel region of the p-type silicon substrate 101, there is formed a silicon oxynitride film (SiON) as the tunnel insulating film (first insulating film) 102. On the tunnel insulating film 102, as an electric charge accumulation layer combined with donor layer (donor-containing electric charge accumulation layer) 603 that works as an electric charge accumulation layer as well as a donor layer, an aluminum gallium nitride film (AlGaN) into which silicon is doped is formed. Furthermore, on the electric charge accumulation layer combined with donor layer 603, an aluminum oxynitride film (AlON) is formed as the block insulating film (second insulating film) 505. On the block insulating film 505, a tantalum nitride film (TaN) is formed as the control gate electrode 506. Then, on the control gate electrode 506, a tungsten film (W) 107 of low-resistance metal is formed as the conductive layer 107.

The composition of the AlGaN film as the electric charge accumulation layer combined with donor layer 603 is set to $(AlN)_{0.45}(GaN)_{0.55}$, and the film thickness thereof is set to approximately 6 nm (equivalent film thickness 2.8 nm). The concentration of silicon in the electric charge accumulation layer combined with donor layer 603 is set to approximately $1.5\times10^{19}$ cm$^{-3}$. Accordingly, the area density of silicon comes to be approximately $9\times10^{12}$ cm$^{-2}$.

The composition of the AlGaN film as the base material of the electric charge accumulation layer combined with donor layer 603 is not necessarily restricted to that of the present embodiment. On the other hand, from a viewpoint of taking advantage of the band alignment and donor level, with regard to $(AlN)_{1-x}(GaN)_x$, it is desired that $x \geq 0.5$ be fulfilled. Furthermore, instead of AlGaN into which Si is doped, an AlGaON layer containing oxygen may be employed. Furthermore, silicon that works as donor impurity atoms in AlGaN of the electric charge accumulation layer combined with donor layer 603 may be replaced with a fourth group element such as Ge.

The composition and thickness of SiON film as the tunnel insulating film 102 is set up similarly as the first embodiment. Moreover, similar to the first embodiment, as the tunnel insulating film 102, films other than the silicon oxynitride film can be used.

The material of the block insulating film 505 is not restricted to aluminum oxynitride, and variations similar to those in the fifth embodiment are possible. As for the material of the control gate electrode 506 and the low-resistance metal layer 107 formed thereon, variations similar to those in the fifth embodiment are possible.

Concerning the method of producing the memory cell shown in FIG. 19, basically, the process in the first embodiment (FIG. 8A, FIG. 8B to FIG. 12A, and FIG. 12B) can be employed without modification. Hereinafter, steps which are different from those in the reference example will be explained.

Steps until the tunnel insulating film 102 is formed are similar to those in the first embodiment, and then the electric charge accumulation layer combined with donor layer 603 is formed. The AlGaN film as the electric charge accumulation layer combined with donor layer 603 is formed by employing the CVD method using organic gallium (Ga(CH$_3$)$_3$), organic aluminum (Al(CH$_3$)$_3$), ammonia (NH$_3$), and silane (SiH$_4$) as source materials. As the method of injecting silicon as n-type dopant into the electric charge accumulation layer combined with donor layer 603, the ion implantation, solid state diffusion, etc. may be employed.

Next, on the electric charge accumulation layer combined with donor layer 603, the AlON film as the block insulating film 505 is formed by employing the CVD method or ALD method arbitrarily using organic aluminum (Al(CH$_3$)$_3$), ammonia (NH$_3$), and water (H$_2$O) as a source material.

Next, a TaN/W layered film as the control gate electrode 506 and conductive layer 107 made of low-resistance metal is formed by employing the reactive sputtering method using a target made of tantalum, and the sputtering method in inactive gas using a target made of tungsten.

The production method in this embodiment is merely an example, and the memory cell shown in FIG. 19 may be formed by employing other production methods. For example, concerning material gas used in the CVD method, other kinds of gas can be used instead. Furthermore, the CVD method or ALD method can be replaced with the sputtering method. Moreover, the above-described respective layers can be formed by employing evaporation methods other than the ALD method, CVD method, and sputtering method, laser ablation method, MBE method, or methods combining those methods.

Seventh Embodiment

The point of the seventh embodiment is that the electric charge accumulation layer is formed using AlGaN type material whose band alignment (from conduction band to valence band) is located at a deep energy position, and an ultrathin metal layer is used as the electron-supplying layer that replaces the donor layer.

Figure 20:
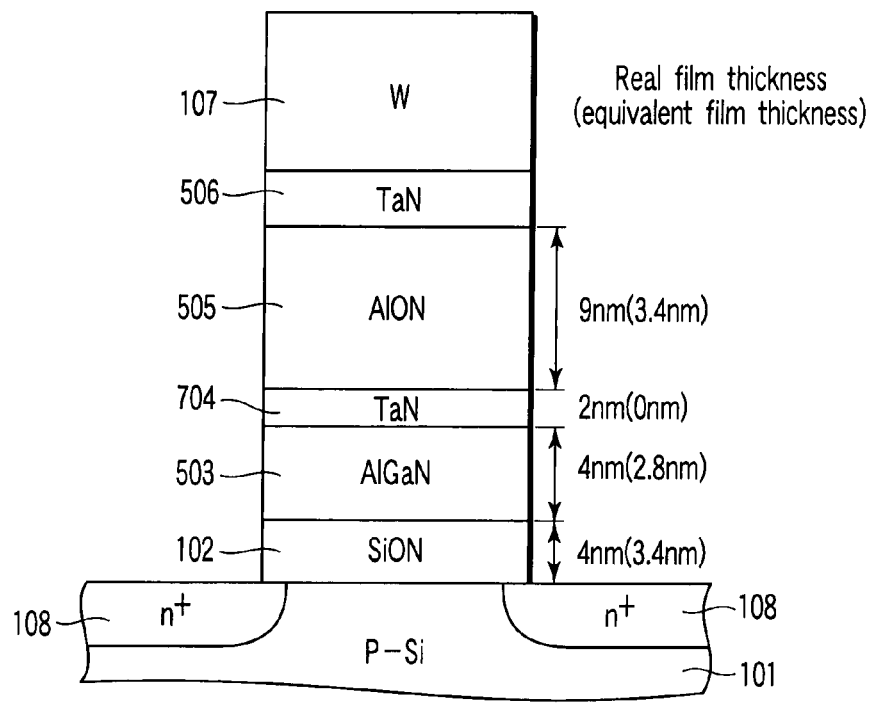
FIG. 20 shows a sectional view indicative of the detailed structure of the memory cell according to a seventh embodiment.

As shown in FIG. 20, on the channel region of the p-type silicon substrate 101, there is formed a silicon oxynitride film (SiON) as the tunnel insulating film (first insulating film) 102. On the tunnel insulating film 102, an aluminum gallium nitride film (AlGaN) is formed as the electric charge accumulation layer 503. On the electric charge accumulation layer 503, a tantalum nitride film (TaN) that works as an electron-supplying layer 704 is formed. On the electron-supplying layer 704, an aluminum oxynitride film (AlON) is formed as the block insulating film (second insulating film) 505. On the block insulating film 505, a tantalum nitride film (TaN) is formed as the control gate electrode 506. On the control gate electrode 506, a tungsten film (W) of low-resistance metal is formed as the conductive layer 107.

The composition and thickness of the SiON film as the tunnel insulating film 102 is set up similarly as the first embodiment. Moreover, similar to the first embodiment, as the tunnel insulating film 102, films other than the silicon oxynitride film can be used. Furthermore, the thickness of the AlON film as the block insulating film 505 is set up similarly as the fifth embodiment.

The composition of the AlGaN film as the electric charge accumulation layer 503 is set to $(AlN)_{0.15}(GaN)_{0.85}$, and the film thickness thereof is set to approximately 4 nm (equivalent film thickness 2.8 nm). The thickness of the tantalum nitride film as the electron-supplying layer 704 is set to approximately 2 nm (equivalent film thickness 0 nm).

The composition of the AlGaN film as the electric charge accumulation layer 503 is not necessarily restricted to that of the present embodiment. On the other hand, so as to make the TaN film on the electric charge accumulation layer 503 sufficiently work as the electron-supplying layer 704, it is desired that the amount of GaN component in AlGaN be large so that the band alignment of AlGaN as the electric charge accumulation layer 503 becomes deep. Specific estimations will be explained as follows.

As is described in Document 1, the electron affinity (energy from vacuum level to conduction band end) of AlN is 3.1 eV, while the electron affinity of GaN is 4.7 eV. Accordingly, when the composition of AlGaN is represented as $(AlN)_{1-x}(GaN)_x$, the electron affinity is calculated as $$[\text{Electron affinity of AlGaN}]=3.1\times(1-x)+4.7\times x (\text{eV})$$

under first-order approximation. Furthermore, the work function of tantalum nitride (TaN) is set around the center of Si band gap (approximately 4.4 eV). Accordingly, as the condition in which electrons transfer from TaN to AlGaN side, and the TaN film sufficiently works as the electron-supplying layer, $$3.1\times(1-x)+4.7\times x \geq 4.4$$

has to be fulfilled. That is $x \geq 0.81$. This means that the TaN film surely works as the electron-supplying layer under this condition. Note that, this does not necessarily deny the possibility that the TaN film works as the electron-supplying layer when the composition "x" of AlGaN is smaller than 0.81.

Based on the above-described consideration, in this embodiment, an AlGaN film that has its composition set to x=0.85 is formed. The AlGaN film or the electric charge accumulation layer 503 may be an AlGaON film that contains a small amount of oxygen. Furthermore, so as to supplement the function of the electron-supplying layer 704, a small amount of atoms such as Si, Ge which work as n-type donor impurity atoms may be contained in AlGaN of the electric charge accumulation layer 503.

The material of the block insulating film 505 is not restricted to aluminum oxynitride, and variations similar to those in the fifth embodiment are possible. As for the material of the control gate electrode 506 and the low-resistance metal layer 107 formed thereon, variations similar to those in the fifth embodiment are possible.

Concerning the method of producing the memory cell shown in FIG. 20, basically, the process in the first embodiment (FIG. 8A, FIG. 8B to FIG. 12A, and FIG. 12B) can be employed without modification. Hereinafter, steps which are different from those in the first embodiment will be explained.

Steps until the tunnel insulating film 102 is formed are similar to those in the first embodiment, and then the electric charge accumulation layer 503 is formed. The AlGaN film as the electric charge accumulation layer 503 is formed by employing the CVD method using organic gallium (Ga(CH$_3$)$_3$), organic aluminum (Al(CH$_3$)$_3$), and ammonia (NH$_3$) as a source material.

Then, on the electric charge accumulation layer 503, an ultrathin TaN film that works as the electron-supplying layer 704 is formed by employing the CVD method using Ta(N(CH$_3$)$_2$)$_5$, or Ta(N(CH$_3$)$_2$)$_5$ and NH$_3$ as a source material.

Then, similar to the fifth embodiment, on the electron-supplying layer 704, the AlON film as the block insulating film 505 is formed by employing the CVD method or ALD method arbitrarily using organic aluminum (Al(CH$_3$)$_3$) and ammonia (NH$_3$), and organic aluminum (Al(CH$_3$)$_3$) and water (H$_2$O) as a source material.

Next, a TaN film as the control gate electrode 506 is formed by employing the CVD method using Ta(N(CH$_3$)$_2$)$_5$, or Ta(N(CH$_3$)$_2$)$_5$ and NH$_3$ as a source material, and subsequently, a W film as the low-resistance metal layer 107 is formed by employing the CVD method using W(CO)$_6$ as a source material.

The production method in this embodiment is merely an example, and the memory cell shown in FIG. 20 may be formed by employing other production methods. For example, concerning material gas used in the CVD method, other kinds of gas can be used instead. Furthermore, the CVD method can be replaced with the sputtering method. Moreover, the above-described respective layers can be formed by employing evaporation methods other than the CVD method and sputtering method, and the laser ablation method, MBE method, or methods combining those methods.

As has been described above, according to the embodiment, since the electron-supplying layer 704 replacing the donor layer is formed between the electric charge accumulation layer 503 being an aluminum gallium nitride film and the block insulating film 505 being an aluminum oxynitride film, electrons supplied from the electron-supplying layer 704 in the electrically neutral bias condition can be captured by traps in the electric charge accumulation layer 503. Accordingly, similar to the first embodiment, in the erase operation of the memory cell, the electrons can be extracted toward the silicon substrate 101 side through the tunnel insulating film 102, which can realize a sufficiently large negative threshold voltage in the erased state.

Figure 21:
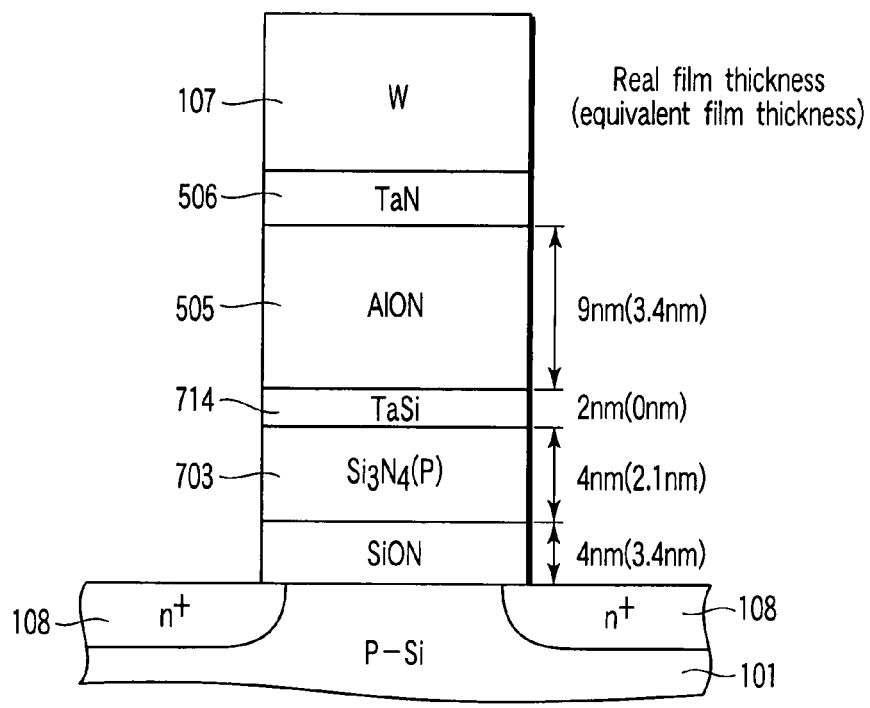
FIG. 21 shows a sectional view indicative of the detailed structure of the memory cell according to a variation of the seventh embodiment.

As a variation of the seventh embodiment, there may be employed a structure shown in FIG. 21. In this variation, the electric charge accumulation layer in the seventh embodiment is replaced with a silicon nitride film, and the electron-supplying layer is replaced with a tantalum silicide film (TaSi$_2$). So as to supplement the function of the electron-supplying layer, donor atoms are contained in the electric charge accumulation layer.

As an electric charge accumulation layer 703, a silicon nitride film containing phosphorus is formed. The thickness of the electric charge accumulation layer 703 is set to approximately 4 nm (equivalent film thickness 2.1 nm). The concentration of phosphorus in the electric charge accumulation layer 703 is set to approximately $1 \times 10^{19}$ cm$^{-3}$. Phosphorus as n-type dopant impurity in the electric charge accumulation layer 703 may be replaced with a fifth group element such as arsenic, antimony, etc. Next, on the electric charge accumulation layer 703, an ultrathin tantalum silicide film (TaSi$_2$) is formed as the electron-supplying layer 714.

Tantalum silicide (TaSi$_2$) is a material which is considered as an alternative gate electrode of n$^+$-type polycrystalline silicon in a logic CMOS, and the work function thereof is close to that of the n$^+$-type polycrystalline silicon. Accordingly, tantalum silicide (TaSi$_2$) supplies electrons to, those traps having the energy level equal to or more than at least 4.1 eV in electron affinity, which are located in the silicon nitride film or the electric charge accumulation layer 703. On the other hand, electrons cannot be supplied to traps which are smaller than 4.1 eV in electron affinity. Accordingly, since phosphorus atoms existing in the silicon nitride film can work as the donor atoms, the phosphorus atoms help supply electrons to traps which are small in electron affinity.

The point of the method of producing the memory cell shown in FIG. 21 which is different from the seventh embodiment is that the silicon nitride film as the electric charge accumulation layer 703 (containing donor atoms) into which phosphorus is doped is formed by employing the CVD method using dichlorosilane (SiH$_2$Cl$_2$), ammonia (NH$_3$), and phosphine (PH$_3$) as a source material. Furthermore, the tantalum silicide film (TaSi$_2$) as the electron-supplying layer 714 is formed by employing the CVD method using Ta(N(CH$_3$)$_2$)$_5$ and SiH$_4$ as a source material. The production method in this embodiment is merely an example, and the memory cell shown in FIG. 21 may be formed by employing other production methods.

<Modifications>

The present invention is not restricted to the above-described respective embodiments.

For example, the electric charge accumulation layer and donor layer may be composed of a plurality of layers respectively, and the layers may have their compositions consecutively changed near the interfaces thereof.

Furthermore, the stack gate structure of the present invention does not necessarily have to be formed on a Si substrate. For example, the stack gate structure of the present invention may be formed on a well formed on a Si substrate. Moreover, the stack gate structure of the present invention may be formed on a SiGe substrate, a Ge substrate, a SiGeC substrate, or a well formed on these substrates, instead of the Si substrate. Yet moreover, the stack gate structure of the present invention may be formed on a SOI (Silicon On Insulator) substrate, a SGOI (Silicon-Germanium On Insulator) substrate, a GOI (Germanium On Insulator) substrate, each of which has a thin film semiconductor formed on an insulating film, or a well formed on these substrates.

Yet furthermore, in these embodiments, the case of forming an n-channel MISFET on a p-type Si substrate (including well) has been described. On the contrary, the present invention may be applied to the case of forming a p-channel MISFET on an n-type Si substrate (including well). In this case, n-type with respect to the source or drain region and substrate region in these embodiments is changed to p-type, while p-type with respect to the same is changed to n-type. Moreover, P, As, Sb of dopant impurity are changed to any one of B, In, and the donor layer (or donor region) is changed to the acceptor layer (or acceptor region).

Yet furthermore, various inventions can be configured by arbitrarily combining the plural components disclosed in the above-described embodiments. For example, some components may be removed from the entire components disclosed in the above-described embodiments, or components of different embodiments may be arbitrarily combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
a plurality of memory cells capable of electrically writing, erasing, and reading information,
each of the memory cells including:
source/drain diffusion layers which are separately formed on a semiconductor substrate;
a first insulating film formed on a channel provided between the source/drain diffusion layers;
an electric charge accumulation layer formed on the first insulating film, the electric charge accumulation layer being made of nitride or oxynitride containing at least one selected from Si, Ge, Ga, and Al;
a donor layer formed on the electric charge accumulation layer, the donor layer being made of nitride or oxynitride containing at least one selected from Si, Ge, Ga, and Al, and containing n-type dopant impurity, wherein an electron affinity of the donor layer is equal to or smaller than an electron affinity of the electric charge accumulation layer, and a film thickness of the donor layer is smaller than a film thickness of the electric charge accumulation layer;
a second insulating film formed on the donor layer, wherein an electron affinity of the second insulating film is smaller than the electron affinity of the donor layer; and
a control gate electrode formed on the second insulating film.

2. The device according to claim 1, wherein
the electric charge accumulation layer is formed of silicon nitride film or silicon oxynitride film, and
the memory cell, further comprising:
a layer formed between the electric charge accumulation layer and the donor layer, the layer being thinner than the electric charge accumulation layer and donor layer, and being formed mainly of silicon oxide film.

3. The device according to claim 1, wherein
the n-type dopant impurity is composed of atoms of a single kind or a plurality of kinds selected from Si, Ge, P, As, and Sb.

4. The device according to claim 1, wherein
a density per unit area of the n-type dopant impurity contained in the donor layer is $9 \times 10^{12}$ cm$^{-2}$ or more.

5. A nonvolatile semiconductor memory device comprising:
a plurality of memory cells capable of electrically writing, erasing, and reading information,
each of the memory cells including:
source/drain diffusion layers which are separately formed on a semiconductor substrate;
a first insulating film formed on a channel provided between the source/drain diffusion layers;
an electric charge accumulation layer formed on the first insulating film, the electric charge accumulation layer being made of nitride or oxynitride containing at least one selected from Si, Ge, Ga, and Al;
an electron-supplying layer formed on the electric charge accumulation layer, the electron-supplying layer being made of metal material, wherein a work function of the electron-supplying layer is equal to or smaller than an electron affinity of the electric charge accumulation layer, and a film thickness of the electron-supplying layer is smaller than a film thickness of the electric charge accumulation layer;
a second insulating film formed on the electron-supplying layer, wherein an electron affinity of the second insulating film is smaller than the work function of the electron-supplying layer; and
a control gate electrode formed on the second insulating film.

6. The device according to claim 5, wherein
the work function of the electron-supplying layer is equal to or smaller than a work function of the control gate electrode.

7. The device according to claim 5, wherein
the second insulating film is composed of a plurality of layers including at least one layer capable of storing negative electric charges.

8. The device according to claim 7, wherein
the layer capable of storing negative electric charges contains boron.

9. The device according to claim 5, wherein
a work function of the control gate electrode is larger than an energy difference between the Si forbidden band center and the vacuum level.

10. A nonvolatile semiconductor memory device comprising:
a plurality of memory cells capable of electrically writing, erasing, and reading information,
each of the memory cells including:
a first insulating film formed on a semiconductor region;
an electric charge accumulation layer formed on the first insulating film, the electric charge accumulation layer being made of nitride or oxynitride containing at least one selected from Si, Ge, Ga, and Al;
a donor layer formed on the electric charge accumulation layer, the donor layer being made of nitride or oxynitride containing at least one selected from Si, Ge, Ga, and Al, and containing n-type dopant impurity, wherein an electron affinity of the donor layer is equal to or smaller than an electron affinity of the electric charge accumulation layer, and a film thickness of the donor layer is smaller than a film thickness of the electric charge accumulation layer;
a second insulating film formed on the donor layer, wherein an electron affinity of the second insulating film is smaller than the electron affinity of the donor layer; and a control gate electrode formed on the second insulating film.

11. The device according to claim 10, wherein
the electric charge accumulation layer is formed of silicon nitride film or silicon oxynitride film, and
the memory cell, further comprising:
a layer formed between the electric charge accumulation layer and the donor layer, the layer being thinner than the electric charge accumulation layer and the donor layer, and being formed mainly of silicon oxide film.

12. The device according to claim 10, wherein
the n-type dopant impurity is composed of atoms of a single kind or a plurality of kinds selected from Si, Ge, P, As, and Sb.

13. The device according to claim 10, wherein
a density per unit area of the n-type dopant impurity contained in the donor layer is $9 \times 10^{12}$ cm$^{-2}$ or more.

14. A nonvolatile semiconductor memory device comprising:
a plurality of memory cells capable of electrically writing, erasing, and reading information,
each of the memory cells including:
a first insulating film formed on a semiconductor region;
an electric charge accumulation layer formed on the first insulating film, the electric charge accumulation layer being made of nitride or oxynitride containing at least one selected from Si, Ge, Ga, and Al;
an electron-supplying layer formed on the electric charge accumulation layer, the electron-supplying layer being made of metal material, wherein a work function of the electron-supplying layer is equal to or smaller than an electron affinity of the electric charge accumulation layer, and a film thickness of the electron-supplying layer is smaller than a film thickness of the electric charge accumulation layer;
a second insulating film formed on the electron-supplying layer, wherein an electron affinity of the second insulating film is smaller than the work function of the electron-supplying layer; and
a control gate electrode formed on the second insulating film.

15. The device according to claim 14, wherein
the work function of the electron-supplying layer is equal to or smaller than a work function of the control gate electrode.

16. The device according to claim 14, wherein
the second insulating film is composed of a plurality of layers including at least one layer capable of storing negative electric charges.

17. The device according to claim 16, wherein
the layer capable of storing negative electric charges contains boron.

18. The device according to claim 14, wherein
a work function of the control gate electrode is larger than an energy difference between the Si forbidden band center and the vacuum level.

* * * * *